(12) United States Patent
Chaji et al.

(10) Patent No.: US 9,990,882 B2
(45) Date of Patent: *Jun. 5, 2018

(54) COMPENSATION ACCURACY

(71) Applicant: Ignis Innovation Inc., Waterloo (CA)

(72) Inventors: Gholamreza Chaji, Waterloo (CA); Nino Zahirovic, Waterloo (CA)

(73) Assignee: Ignis Innovation Inc., Waterloo (CA)

(*) Notice: Subject to any disclaimer, the term of this patent is extended or adjusted under 35 U.S.C. 154(b) by 0 days. days.

This patent is subject to a terminal disclaimer.

(21) Appl. No.: 15/219,377

(22) Filed: Jul. 26, 2016

(65) Prior Publication Data

US 2016/0335952 A1 Nov. 17, 2016

Related U.S. Application Data

(63) Continuation of application No. 14/455,990, filed on Aug. 11, 2014, now Pat. No. 9,437,137.

(Continued)

(51) Int. Cl.
   *G09G 5/02* (2006.01)
   *G09G 3/3233* (2016.01)
   (Continued)

(52) U.S. Cl.
   CPC ......... *G09G 3/3233* (2013.01); *G09G 3/2022* (2013.01); *G09G 3/3266* (2013.01);
   (Continued)

(58) Field of Classification Search
   CPC .. G09G 3/2081; G09G 3/2022; G09G 3/3225; G09G 2320/043;
   (Continued)

(56) References Cited

U.S. PATENT DOCUMENTS 3,506,851 A 4/1970 Polkinghorn et al.
3,774,055 A 11/1973 Bapat et al.
(Continued)

FOREIGN PATENT DOCUMENTS

CA 1 294 034 1/1992
CA 2 109 951 11/1992
(Continued)

OTHER PUBLICATIONS

Ahnood et al.: "Effect of threshold voltage instability on field effect mobility in thin film transistors deduced from constant current measurements"; dated Aug. 2009.
(Continued)

*Primary Examiner* — Prabodh M Dharia
(74) *Attorney, Agent, or Firm* — Nixon Peabody LLP

(57) ABSTRACT

A system uses image data, representing images to be displayed in successive frames, to drive a display having pixels that include a drive transistor and an organic light emitting device by dividing each frame into at least first and second sub-frames, supplying the image data during one of the sub-frames, supplying compensation data during the other of the sub-frames, compensating image data based on the compensation data, and supplying each pixel with a drive current that is based on the compensated image data during each frame. The compensated image data may be supplied from a driver having a preselected data resolution, and the system determines whether the compensated image data is greater than the data resolution of the driver, and if the compensated image data is greater than the data resolution of the driver, transfers the excess compensated image data to a different sub-frame.

16 Claims, 17 Drawing Sheets

Related U.S. Application Data

(60) Provisional application No. 61/864,972, filed on Aug. 12, 2013.

(51) Int. Cl.
  *G09G 3/20* (2006.01)
  *G09G 3/3266* (2016.01)
  *G09G 3/3291* (2016.01)
  *H01L 27/32* (2006.01)

(52) U.S. Cl.
  CPC ... *G09G 3/3291* (2013.01); *G09G 2300/0809* (2013.01); *G09G 2300/0819* (2013.01); *G09G 2320/043* (2013.01); *G09G 2320/045* (2013.01); *G09G 2320/0646* (2013.01); *H01L 27/3248* (2013.01)

(58) Field of Classification Search
  CPC ... G09G 2320/0276; G09G 2320/0626; G09G 2320/0673; G09G 2360/16; G09G 2360/144
  USPC ........... 345/76, 89, 204–215, 690, 699, 694; 348/56
  See application file for complete search history.

(56) References Cited

U.S. PATENT DOCUMENTS

| | | |
|---|---|---|
| 4,090,096 A | 5/1978 | Nagami |
| 4,160,934 A | 7/1979 | Kirsch |
| 4,354,162 A | 10/1982 | Wright |
| 4,943,956 A | 7/1990 | Noro |
| 4,996,523 A | 2/1991 | Bell et al. |
| 5,153,420 A | 10/1992 | Hack et al. |
| 5,198,803 A | 3/1993 | Shie et al. |
| 5,204,661 A | 4/1993 | Hack et al. |
| 5,266,515 A | 11/1993 | Robb et al. |
| 5,489,918 A | 2/1996 | Mosier |
| 5,498,880 A | 3/1996 | Lee et al. |
| 5,557,342 A | 9/1996 | Eto et al. |
| 5,572,444 A | 11/1996 | Lentz et al. |
| 5,589,847 A | 12/1996 | Lewis |
| 5,619,033 A | 4/1997 | Weisfield |
| 5,648,276 A | 7/1997 | Hara et al. |
| 5,670,973 A | 9/1997 | Bassetti et al. |
| 5,684,365 A | 11/1997 | Tang et al. |
| 5,691,783 A | 11/1997 | Numao et al. |
| 5,714,968 A | 2/1998 | Ikeda |
| 5,723,950 A | 3/1998 | Wei et al. |
| 5,744,824 A | 4/1998 | Kousai et al. |
| 5,745,660 A | 4/1998 | Kolpatzik et al. |
| 5,748,160 A | 5/1998 | Shieh et al. |
| 5,815,303 A | 9/1998 | Berlin |
| 5,870,071 A | 2/1999 | Kawahata |
| 5,874,803 A | 2/1999 | Garbuzov et al. |
| 5,880,582 A | 3/1999 | Sawada |
| 5,903,248 A | 5/1999 | Irwin |
| 5,917,280 A | 6/1999 | Burrows et al. |
| 5,923,794 A | 7/1999 | McGrath et al. |
| 5,945,972 A | 8/1999 | Okumura et al. |
| 5,949,398 A | 9/1999 | Kim |
| 5,952,789 A | 9/1999 | Stewart et al. |
| 5,952,991 A | 9/1999 | Akiyama et al. |
| 5,982,104 A | 11/1999 | Sasaki et al. |
| 5,990,629 A | 11/1999 | Yamada et al. |
| 6,023,259 A | 2/2000 | Howard et al. |
| 6,069,365 A | 5/2000 | Chow et al. |
| 6,091,203 A | 7/2000 | Kawashima et al. |
| 6,097,360 A | 8/2000 | Holloman |
| 6,144,222 A | 11/2000 | Ho |
| 6,177,915 B1 | 1/2001 | Beeteson et al. |
| 6,229,506 B1 | 5/2001 | Dawson et al. |
| 6,229,508 B1 | 5/2001 | Kane |
| 6,246,180 B1 | 6/2001 | Nishigaki |
| 6,252,248 B1 | 6/2001 | Sano et al. |
| 6,259,424 B1 | 7/2001 | Kurogane |
| 6,262,589 B1 | 7/2001 | Tamukai |
| 6,271,825 B1 | 8/2001 | Greene et al. |
| 6,288,696 B1 | 9/2001 | Holloman |
| 6,304,039 B1 | 10/2001 | Appelberg et al. |
| 6,307,322 B1 | 10/2001 | Dawson et al. |
| 6,310,962 B1 | 10/2001 | Chung et al. |
| 6,320,325 B1 | 11/2001 | Cok et al. |
| 6,323,631 B1 | 11/2001 | Juang |
| 6,356,029 B1 | 3/2002 | Hunter |
| 6,373,454 B1 | 4/2002 | Knapp et al. |
| 6,392,617 B1 | 5/2002 | Gleason |
| 6,414,661 B1 | 7/2002 | Shen et al. |
| 6,417,825 B1 | 7/2002 | Stewart et al. |
| 6,433,488 B1 | 8/2002 | Bu |
| 6,437,106 B1 | 8/2002 | Stoner et al. |
| 6,445,369 B1 | 9/2002 | Yang et al. |
| 6,475,845 B2 | 11/2002 | Kimura |
| 6,501,098 B2 | 12/2002 | Yamazaki |
| 6,501,466 B1 | 12/2002 | Yamagishi et al. |
| 6,518,962 B2 | 2/2003 | Kimura et al. |
| 6,522,315 B2 | 2/2003 | Ozawa et al. |
| 6,525,683 B1 | 2/2003 | Gu |
| 6,531,827 B2 | 3/2003 | Kawashima |
| 6,542,138 B1 | 4/2003 | Shannon et al. |
| 6,555,420 B1 | 4/2003 | Yamazaki |
| 6,580,408 B1 | 6/2003 | Bae et al. |
| 6,580,657 B2 | 6/2003 | Sanford et al. |
| 6,583,398 B2 | 6/2003 | Harkin |
| 6,583,775 B1 | 6/2003 | Sekiya et al. |
| 6,594,606 B2 | 7/2003 | Everitt |
| 6,618,030 B2 | 9/2003 | Kane et al. |
| 6,639,244 B1 | 10/2003 | Yamazaki et al. |
| 6,668,645 B1 | 12/2003 | Gilmour et al. |
| 6,677,713 B1 | 1/2004 | Sung |
| 6,680,580 B1 | 1/2004 | Sung |
| 6,687,266 B1 | 2/2004 | Ma et al. |
| 6,690,000 B1 | 2/2004 | Muramatsu et al. |
| 6,690,344 B1 | 2/2004 | Takeuchi et al. |
| 6,693,388 B2 | 2/2004 | Oomura |
| 6,693,610 B2 | 2/2004 | Shannon et al. |
| 6,697,057 B2 | 2/2004 | Koyama et al. |
| 6,720,942 B2 | 4/2004 | Lee et al. |
| 6,724,151 B2 | 4/2004 | Yoo |
| 6,734,636 B2 | 5/2004 | Sanford et al. |
| 6,738,034 B2 | 5/2004 | Kaneko et al. |
| 6,738,035 B1 | 5/2004 | Fan |
| 6,753,655 B2 | 6/2004 | Shih et al. |
| 6,753,834 B2 | 6/2004 | Mikami et al. |
| 6,756,741 B2 | 6/2004 | Li |
| 6,756,952 B1 | 6/2004 | Decaux et al. |
| 6,756,958 B2 | 6/2004 | Furuhashi et al. |
| 6,771,028 B1 | 8/2004 | Winters |
| 6,777,712 B2 | 8/2004 | Sanford et al. |
| 6,777,888 B2 | 8/2004 | Kondo |
| 6,781,567 B2 | 8/2004 | Kimura |
| 6,806,497 B2 | 10/2004 | Jo |
| 6,806,638 B2 | 10/2004 | Lin et al. |
| 6,806,857 B2 | 10/2004 | Sempel et al. |
| 6,809,706 B2 | 10/2004 | Shimoda |
| 6,815,975 B2 | 11/2004 | Nara et al. |
| 6,828,950 B2 | 12/2004 | Koyama |
| 6,853,371 B2 | 2/2005 | Miyajima et al. |
| 6,859,193 B1 | 2/2005 | Yumoto |
| 6,873,117 B2 | 3/2005 | Ishizuka |
| 6,876,346 B2 | 4/2005 | Anzai et al. |
| 6,885,356 B2 | 4/2005 | Hashimoto |
| 6,900,485 B2 | 5/2005 | Lee |
| 6,903,734 B2 | 6/2005 | Eu |
| 6,909,243 B2 | 6/2005 | Inukai |
| 6,909,419 B2 | 6/2005 | Zavracky et al. |
| 6,911,960 B1 | 6/2005 | Yokoyama |
| 6,911,964 B2 | 6/2005 | Lee et al. |
| 6,914,448 B2 | 7/2005 | Jinno |
| 6,919,871 B2 | 7/2005 | Kwon |
| 6,924,602 B2 | 8/2005 | Komiya |
| 6,937,215 B2 | 8/2005 | Lo |
| 6,937,220 B2 | 8/2005 | Kitaura et al. |

(56) References Cited

U.S. PATENT DOCUMENTS

| | | |
|---|---|---|
| 6,940,214 B1 | 9/2005 | Komiya et al. |
| 6,943,500 B2 | 9/2005 | LeChevalier |
| 6,947,022 B2 | 9/2005 | McCartney |
| 6,954,194 B2 | 10/2005 | Matsumoto et al. |
| 6,956,547 B2 | 10/2005 | Bae et al. |
| 6,975,142 B2 | 12/2005 | Azami et al. |
| 6,975,332 B2 | 12/2005 | Arnold et al. |
| 6,995,510 B2 | 2/2006 | Murakami et al. |
| 6,995,519 B2 | 2/2006 | Arnold et al. |
| 7,023,408 B2 | 4/2006 | Chen et al. |
| 7,027,015 B2 | 4/2006 | Booth, Jr. et al. |
| 7,027,078 B2 | 4/2006 | Reihl |
| 7,034,793 B2 | 4/2006 | Sekiya et al. |
| 7,038,392 B2 | 5/2006 | Libsch et al. |
| 7,057,359 B2 | 6/2006 | Hung et al. |
| 7,061,451 B2 | 6/2006 | Kimura |
| 7,064,733 B2 | 6/2006 | Cok et al. |
| 7,071,932 B2 | 7/2006 | Libsch et al. |
| 7,088,051 B1 | 8/2006 | Cok |
| 7,088,052 B2 | 8/2006 | Kimura |
| 7,102,378 B2 | 9/2006 | Kuo et al. |
| 7,106,285 B2 | 9/2006 | Naugler |
| 7,112,820 B2 | 9/2006 | Change et al. |
| 7,116,058 B2 | 10/2006 | Lo et al. |
| 7,119,493 B2 | 10/2006 | Fryer et al. |
| 7,122,835 B1 | 10/2006 | Ikeda et al. |
| 7,127,380 B1 | 10/2006 | Iverson et al. |
| 7,129,914 B2 | 10/2006 | Knapp et al. |
| 7,164,417 B2 | 1/2007 | Cok |
| 7,193,589 B2 | 3/2007 | Yoshida et al. |
| 7,224,332 B2 | 5/2007 | Cok |
| 7,227,519 B1 | 6/2007 | Kawase et al. |
| 7,245,277 B2 | 7/2007 | Ishizuka |
| 7,248,236 B2 | 7/2007 | Nathan et al. |
| 7,262,753 B2 | 8/2007 | Tanghe et al. |
| 7,274,363 B2 | 9/2007 | Ishizuka et al. |
| 7,310,092 B2 | 12/2007 | Imamura |
| 7,315,295 B2 | 1/2008 | Kimura |
| 7,321,348 B2 | 1/2008 | Cok et al. |
| 7,339,560 B2 | 3/2008 | Sun |
| 7,355,574 B1 | 4/2008 | Leon et al. |
| 7,358,941 B2 | 4/2008 | Ono et al. |
| 7,368,868 B2 | 5/2008 | Sakamoto |
| 7,411,571 B2 | 8/2008 | Huh |
| 7,414,600 B2 | 8/2008 | Nathan et al. |
| 7,423,617 B2 | 9/2008 | Giraldo et al. |
| 7,466,292 B2 | 12/2008 | Kojima |
| 7,474,285 B2 | 1/2009 | Kimura |
| 7,502,000 B2 | 3/2009 | Yuki et al. |
| 7,528,812 B2 | 5/2009 | Tsuge et al. |
| 7,535,449 B2 | 5/2009 | Miyazawa |
| 7,554,512 B2 | 6/2009 | Steer |
| 7,569,849 B2 | 8/2009 | Nathan et al. |
| 7,576,718 B2 | 8/2009 | Miyazawa |
| 7,580,012 B2 | 8/2009 | Kim et al. |
| 7,589,707 B2 | 9/2009 | Chou |
| 7,609,239 B2 | 10/2009 | Chang |
| 7,619,594 B2 | 11/2009 | Hu |
| 7,619,597 B2 | 11/2009 | Nathan et al. |
| 7,633,470 B2 | 12/2009 | Kane |
| 7,656,370 B2 | 2/2010 | Schneider et al. |
| 7,800,558 B2 | 9/2010 | Routley et al. |
| 7,847,764 B2 | 12/2010 | Cok et al. |
| 7,859,492 B2 | 12/2010 | Kohno |
| 7,868,859 B2 | 1/2011 | Tomida et al. |
| 7,876,294 B2 | 1/2011 | Sasaki et al. |
| 7,924,249 B2 | 4/2011 | Nathan et al. |
| 7,932,883 B2 | 4/2011 | Klompenhouwer et al. |
| 7,969,390 B2 | 6/2011 | Yoshida |
| 7,978,187 B2 | 7/2011 | Nathan et al. |
| 7,994,712 B2 | 8/2011 | Sung et al. |
| 8,026,876 B2 | 9/2011 | Nathan et al. |
| 8,026,934 B2 | 9/2011 | Tomizawa |
| 8,049,420 B2 | 11/2011 | Tamura et al. |
| 8,077,123 B2 | 12/2011 | Naugler, Jr. |
| 8,115,707 B2 | 2/2012 | Nathan et al. |
| 8,208,084 B2 | 6/2012 | Lin |
| 8,223,177 B2 | 7/2012 | Nathan et al. |
| 8,232,939 B2 | 7/2012 | Nathan et al. |
| 8,259,044 B2 | 9/2012 | Nathan et al. |
| 8,264,431 B2 | 9/2012 | Bulovic et al. |
| 8,279,143 B2 | 10/2012 | Nathan et al. |
| 8,339,386 B2 | 12/2012 | Leon et al. |
| 8,493,296 B2 | 7/2013 | Ogawa |
| 2001/0002703 A1 | 6/2001 | Koyama |
| 2001/0009283 A1 | 7/2001 | Arao et al. |
| 2001/0024181 A1 | 9/2001 | Kubota |
| 2001/0024186 A1 | 9/2001 | Kane et al. |
| 2001/0026257 A1 | 10/2001 | Kimura |
| 2001/0026725 A1 | 10/2001 | Petteruti et al. |
| 2001/0030323 A1 | 10/2001 | Ikeda |
| 2001/0035863 A1 | 11/2001 | Kimura |
| 2001/0040541 A1 | 11/2001 | Yoneda et al. |
| 2001/0043173 A1 | 11/2001 | Troutman |
| 2001/0045929 A1 | 11/2001 | Prache |
| 2001/0052606 A1 | 12/2001 | Sempel et al. |
| 2001/0052940 A1 | 12/2001 | Hagihara et al. |
| 2002/0000576 A1 | 1/2002 | Inukai |
| 2002/0011796 A1 | 1/2002 | Koyama |
| 2002/0011799 A1 | 1/2002 | Kimura |
| 2002/0012057 A1 | 1/2002 | Kimura |
| 2002/0014851 A1 | 2/2002 | Tai et al. |
| 2002/0018034 A1 | 2/2002 | Ohki et al. |
| 2002/0030190 A1 | 3/2002 | Ohtani et al. |
| 2002/0047565 A1 | 4/2002 | Nara et al. |
| 2002/0052086 A1 | 5/2002 | Maeda |
| 2002/0067134 A1 | 6/2002 | Kawashima |
| 2002/0084463 A1 | 7/2002 | Sanford et al. |
| 2002/0101172 A1 | 8/2002 | Bu |
| 2002/0105279 A1 | 8/2002 | Kimura |
| 2002/0117722 A1 | 8/2002 | Osada et al. |
| 2002/0122308 A1 | 9/2002 | Ikeda |
| 2002/0158587 A1 | 10/2002 | Komiya |
| 2002/0158666 A1 | 10/2002 | Azami et al. |
| 2002/0158823 A1 | 10/2002 | Zavracky et al. |
| 2002/0167474 A1 | 11/2002 | Everitt |
| 2002/0180369 A1 | 12/2002 | Koyama |
| 2002/0180721 A1 | 12/2002 | Kimura et al. |
| 2002/0181276 A1 | 12/2002 | Yamazaki |
| 2002/0186214 A1 | 12/2002 | Siwinski |
| 2002/0190924 A1 | 12/2002 | Asano et al. |
| 2002/0190971 A1 | 12/2002 | Nakamura et al. |
| 2002/0195967 A1 | 12/2002 | Kim et al. |
| 2002/0195968 A1 | 12/2002 | Sanford et al. |
| 2003/0020413 A1 | 1/2003 | Oomura |
| 2003/0030603 A1 | 2/2003 | Shimoda |
| 2003/0043088 A1 | 3/2003 | Booth et al. |
| 2003/0057895 A1 | 3/2003 | Kimura |
| 2003/0058226 A1 | 3/2003 | Bertram et al. |
| 2003/0062524 A1 | 4/2003 | Kimura |
| 2003/0063081 A1 | 4/2003 | Kimura et al. |
| 2003/0071821 A1 | 4/2003 | Sundahl et al. |
| 2003/0076048 A1 | 4/2003 | Rutherford |
| 2003/0090447 A1 | 5/2003 | Kimura |
| 2003/0090481 A1 | 5/2003 | Kimura |
| 2003/0107560 A1 | 6/2003 | Yumoto et al. |
| 2003/0111966 A1 | 6/2003 | Mikami et al. |
| 2003/0122745 A1 | 7/2003 | Miyazawa |
| 2003/0122813 A1 | 7/2003 | Ishizuki et al. |
| 2003/0142088 A1 | 7/2003 | LeChevalier |
| 2003/0151569 A1 | 8/2003 | Lee et al. |
| 2003/0156101 A1 | 8/2003 | Le Chevalier |
| 2003/0174152 A1 | 9/2003 | Noguchi |
| 2003/0179626 A1 | 9/2003 | Sanford et al. |
| 2003/0185438 A1 | 10/2003 | Osawa et al. |
| 2003/0197663 A1 | 10/2003 | Lee et al. |
| 2003/0210256 A1 | 11/2003 | Mori et al. |
| 2003/0230141 A1 | 12/2003 | Gilmour et al. |
| 2003/0230980 A1 | 12/2003 | Forrest et al. |
| 2003/0231148 A1 | 12/2003 | Lin et al. |
| 2004/0032382 A1 | 2/2004 | Cok et al. |
| 2004/0041750 A1 | 3/2004 | Abe |
| 2004/0066357 A1 | 4/2004 | Kawasaki |
| 2004/0070557 A1 | 4/2004 | Asano et al. |

(56) References Cited

U.S. PATENT DOCUMENTS

| | | |
|---|---|---|
| 2004/0070565 A1 | 4/2004 | Nayar et al. |
| 2004/0090186 A1 | 5/2004 | Kanauchi et al. |
| 2004/0090400 A1 | 5/2004 | Yoo |
| 2004/0095297 A1 | 5/2004 | Libsch et al. |
| 2004/0100427 A1 | 5/2004 | Miyazawa |
| 2004/0108518 A1 | 6/2004 | Jo |
| 2004/0135749 A1 | 7/2004 | Kondakov et al. |
| 2004/0140982 A1 | 7/2004 | Pate |
| 2004/0145547 A1 | 7/2004 | Oh |
| 2004/0150592 A1 | 8/2004 | Mizukoshi et al. |
| 2004/0150594 A1 | 8/2004 | Koyama et al. |
| 2004/0150595 A1 | 8/2004 | Kasai |
| 2004/0155841 A1 | 8/2004 | Kasai |
| 2004/0174347 A1 | 9/2004 | Sun et al. |
| 2004/0174349 A1 | 9/2004 | Libsch et al. |
| 2004/0174354 A1 | 9/2004 | Ono et al. |
| 2004/0178743 A1 | 9/2004 | Miller et al. |
| 2004/0183759 A1 | 9/2004 | Stevenson et al. |
| 2004/0196275 A1 | 10/2004 | Hattori |
| 2004/0207615 A1 | 10/2004 | Yumoto |
| 2004/0227697 A1 | 11/2004 | Mori |
| 2004/0239596 A1 | 12/2004 | Ono et al. |
| 2004/0252089 A1 | 12/2004 | Ono et al. |
| 2004/0257313 A1 | 12/2004 | Kawashima et al. |
| 2004/0257353 A1 | 12/2004 | Imamura et al. |
| 2004/0257355 A1 | 12/2004 | Naugler |
| 2004/0263437 A1 | 12/2004 | Hattori |
| 2004/0263444 A1 | 12/2004 | Kimura |
| 2004/0263445 A1 | 12/2004 | Inukai et al. |
| 2004/0263541 A1 | 12/2004 | Takeuchi et al. |
| 2005/0007355 A1 | 1/2005 | Miura |
| 2005/0007357 A1 | 1/2005 | Yamashita et al. |
| 2005/0007392 A1 | 1/2005 | Kasai et al. |
| 2005/0017650 A1 | 1/2005 | Fryer et al. |
| 2005/0024081 A1 | 2/2005 | Kuo et al. |
| 2005/0024393 A1 | 2/2005 | Kondo et al. |
| 2005/0030267 A1 | 2/2005 | Tanghe et al. |
| 2005/0057484 A1 | 3/2005 | Diefenbaugh et al. |
| 2005/0057580 A1 | 3/2005 | Yamano et al. |
| 2005/0067970 A1 | 3/2005 | Libsch et al. |
| 2005/0067971 A1 | 3/2005 | Kane |
| 2005/0068270 A1 | 3/2005 | Awakura |
| 2005/0068275 A1 | 3/2005 | Kane |
| 2005/0073264 A1 | 4/2005 | Matsumoto |
| 2005/0083323 A1 | 4/2005 | Suzuki et al. |
| 2005/0088103 A1 | 4/2005 | Kageyama et al. |
| 2005/0110420 A1 | 5/2005 | Arnold et al. |
| 2005/0110807 A1 | 5/2005 | Chang |
| 2005/0140598 A1 | 6/2005 | Kim et al. |
| 2005/0140610 A1 | 6/2005 | Smith et al. |
| 2005/0145891 A1 | 7/2005 | Abe |
| 2005/0156831 A1 | 7/2005 | Yamazaki et al. |
| 2005/0162079 A1 | 7/2005 | Sakamoto |
| 2005/0168416 A1 | 8/2005 | Hashimoto et al. |
| 2005/0179626 A1 | 8/2005 | Yuki et al. |
| 2005/0179628 A1 | 8/2005 | Kimura |
| 2005/0185200 A1 | 8/2005 | Tobol |
| 2005/0200575 A1 | 9/2005 | Kim et al. |
| 2005/0206590 A1 | 9/2005 | Sasaki et al. |
| 2005/0212787 A1 | 9/2005 | Noguchi et al. |
| 2005/0219184 A1 | 10/2005 | Zehner et al. |
| 2005/0225683 A1 | 10/2005 | Nozawa |
| 2005/0248515 A1 | 11/2005 | Naugler et al. |
| 2005/0269959 A1 | 12/2005 | Uchino et al. |
| 2005/0269960 A1 | 12/2005 | Ono et al. |
| 2005/0280615 A1 | 12/2005 | Cok et al. |
| 2005/0280766 A1 | 12/2005 | Johnson et al. |
| 2005/0285822 A1 | 12/2005 | Reddy et al. |
| 2005/0285825 A1 | 12/2005 | Eom et al. |
| 2006/0001613 A1 | 1/2006 | Routley et al. |
| 2006/0007072 A1 | 1/2006 | Choi et al. |
| 2006/0007249 A1 | 1/2006 | Reddy et al. |
| 2006/0012310 A1 | 1/2006 | Chen et al. |
| 2006/0012311 A1 | 1/2006 | Ogawa |
| 2006/0022305 A1 | 2/2006 | Yamashita |
| 2006/0027807 A1 | 2/2006 | Nathan et al. |
| 2006/0030084 A1 | 2/2006 | Young |
| 2006/0038758 A1 | 2/2006 | Routley et al. |
| 2006/0038762 A1 | 2/2006 | Chou |
| 2006/0066533 A1 | 3/2006 | Sato et al. |
| 2006/0077135 A1 | 4/2006 | Cok et al. |
| 2006/0077142 A1 | 4/2006 | Kwon |
| 2006/0082523 A1 | 4/2006 | Guo et al. |
| 2006/0092185 A1 | 5/2006 | Jo et al. |
| 2006/0097628 A1 | 5/2006 | Suh et al. |
| 2006/0097631 A1 | 5/2006 | Lee |
| 2006/0103611 A1 | 5/2006 | Choi |
| 2006/0149493 A1 | 7/2006 | Sambandan et al. |
| 2006/0170623 A1 | 8/2006 | Naugler, Jr. et al. |
| 2006/0176250 A1 | 8/2006 | Nathan et al. |
| 2006/0208961 A1 | 9/2006 | Nathan et al. |
| 2006/0208971 A1 | 9/2006 | Deane |
| 2006/0214888 A1 | 9/2006 | Schneider et al. |
| 2006/0221015 A1* | 10/2006 | Shirasaki ............... G09G 3/325 345/77 |
| 2006/0232522 A1 | 10/2006 | Roy et al. |
| 2006/0244697 A1 | 11/2006 | Lee et al. |
| 2006/0261841 A1 | 11/2006 | Fish |
| 2006/0273997 A1 | 12/2006 | Nathan et al. |
| 2006/0279481 A1 | 12/2006 | Haruna et al. |
| 2006/0284801 A1 | 12/2006 | Yoon et al. |
| 2006/0284895 A1 | 12/2006 | Marcu et al. |
| 2006/0290618 A1 | 12/2006 | Goto |
| 2007/0001937 A1 | 1/2007 | Park et al. |
| 2007/0001939 A1 | 1/2007 | Hashimoto et al. |
| 2007/0008251 A1 | 1/2007 | Kohno et al. |
| 2007/0008268 A1 | 1/2007 | Park et al. |
| 2007/0008297 A1 | 1/2007 | Bassetti |
| 2007/0040769 A1* | 2/2007 | Tai ............... G09G 3/3233 345/76 |
| 2007/0057873 A1 | 3/2007 | Uchino et al. |
| 2007/0057874 A1 | 3/2007 | Le Roy et al. |
| 2007/0069998 A1 | 3/2007 | Naugler et al. |
| 2007/0075727 A1 | 4/2007 | Nakano et al. |
| 2007/0076226 A1 | 4/2007 | Klompenhouwer et al. |
| 2007/0080905 A1 | 4/2007 | Takahara |
| 2007/0080906 A1 | 4/2007 | Tanabe |
| 2007/0080908 A1 | 4/2007 | Nathan et al. |
| 2007/0097038 A1 | 5/2007 | Yamazaki et al. |
| 2007/0097041 A1 | 5/2007 | Park et al. |
| 2007/0103419 A1 | 5/2007 | Uchino et al. |
| 2007/0115221 A1 | 5/2007 | Buchhauser et al. |
| 2007/0164664 A1 | 7/2007 | Ludwicki et al. |
| 2007/0182671 A1 | 8/2007 | Nathan et al. |
| 2007/0182914 A1* | 8/2007 | Hwang ............... G09G 3/2096 349/192 |
| 2007/0236440 A1 | 10/2007 | Wacyk et al. |
| 2007/0236517 A1 | 10/2007 | Kimpe |
| 2007/0241999 A1 | 10/2007 | Lin |
| 2007/0273294 A1 | 11/2007 | Nagayama |
| 2007/0285359 A1 | 12/2007 | Ono |
| 2007/0290958 A1 | 12/2007 | Cok |
| 2007/0296672 A1 | 12/2007 | Kim et al. |
| 2008/0001525 A1 | 1/2008 | Chao et al. |
| 2008/0001544 A1 | 1/2008 | Murakami et al. |
| 2008/0018570 A1* | 1/2008 | Gerets ............... G09G 3/3208 345/84 |
| 2008/0030518 A1 | 2/2008 | Higgins et al. |
| 2008/0036708 A1 | 2/2008 | Shirasaki |
| 2008/0042942 A1 | 2/2008 | Takahashi |
| 2008/0042948 A1 | 2/2008 | Yamashita et al. |
| 2008/0048951 A1 | 2/2008 | Naugler, Jr. et al. |
| 2008/0055209 A1 | 3/2008 | Cok |
| 2008/0055211 A1 | 3/2008 | Ogawa |
| 2008/0074413 A1 | 3/2008 | Ogura |
| 2008/0088549 A1 | 4/2008 | Nathan et al. |
| 2008/0088648 A1 | 4/2008 | Nathan et al. |
| 2008/0111766 A1 | 5/2008 | Uchino et al. |
| 2008/0116787 A1 | 5/2008 | Hsu et al. |
| 2008/0117144 A1 | 5/2008 | Nakano et al. |
| 2008/0150845 A1 | 6/2008 | Ishii et al. |
| 2008/0150847 A1 | 6/2008 | Kim et al. |
| 2008/0158115 A1 | 7/2008 | Cordes et al. |
| 2008/0158648 A1 | 7/2008 | Cummings |

(56) References Cited

U.S. PATENT DOCUMENTS

| | | |
|---|---|---|
| 2008/0198103 A1 | 8/2008 | Toyomura et al. |
| 2008/0211749 A1 | 9/2008 | Weitbruch et al. |
| 2008/0231558 A1 | 9/2008 | Naugler |
| 2008/0231562 A1 | 9/2008 | Kwon |
| 2008/0231625 A1 | 9/2008 | Minami et al. |
| 2008/0252223 A1 | 10/2008 | Toyoda et al. |
| 2008/0252571 A1 | 10/2008 | Hente et al. |
| 2008/0259020 A1 | 10/2008 | Fisekovic et al. |
| 2008/0290805 A1 | 11/2008 | Yamada et al. |
| 2008/0297055 A1 | 12/2008 | Miyake et al. |
| 2009/0027423 A1* | 1/2009 | Kwon .................. G09G 3/3233 345/690 |
| 2009/0058772 A1 | 3/2009 | Lee |
| 2009/0109142 A1 | 4/2009 | Takahara |
| 2009/0121994 A1 | 5/2009 | Miyata |
| 2009/0146926 A1 | 6/2009 | Sung et al. |
| 2009/0160743 A1 | 6/2009 | Tomida et al. |
| 2009/0174628 A1 | 7/2009 | Wang et al. |
| 2009/0184901 A1 | 7/2009 | Kwon |
| 2009/0195483 A1 | 8/2009 | Naugler, Jr. et al. |
| 2009/0201281 A1 | 8/2009 | Routley et al. |
| 2009/0206764 A1 | 8/2009 | Schemmann et al. |
| 2009/0213046 A1 | 8/2009 | Nam |
| 2009/0244046 A1 | 10/2009 | Seto |
| 2010/0004891 A1 | 1/2010 | Ahlers et al. |
| 2010/0026725 A1 | 2/2010 | Smith |
| 2010/0039422 A1 | 2/2010 | Seto |
| 2010/0039458 A1 | 2/2010 | Nathan et al. |
| 2010/0060911 A1 | 3/2010 | Marcu et al. |
| 2010/0079419 A1 | 4/2010 | Shibusawa |
| 2010/0165002 A1 | 7/2010 | Ahn |
| 2010/0194670 A1 | 8/2010 | Cok |
| 2010/0207960 A1 | 8/2010 | Kimpe et al. |
| 2010/0225630 A1 | 9/2010 | Levey et al. |
| 2010/0251295 A1 | 9/2010 | Amento et al. |
| 2010/0277400 A1 | 11/2010 | Jeong |
| 2010/0315319 A1 | 12/2010 | Cok et al. |
| 2011/0063197 A1 | 3/2011 | Chung et al. |
| 2011/0069051 A1 | 3/2011 | Nakamura et al. |
| 2011/0069089 A1 | 3/2011 | Kopf et al. |
| 2011/0069096 A1 | 3/2011 | Li |
| 2011/0074750 A1 | 3/2011 | Leon et al. |
| 2011/0130981 A1 | 6/2011 | Chaji |
| 2011/0149166 A1 | 6/2011 | Botzas et al. |
| 2011/0181630 A1 | 7/2011 | Smith et al. |
| 2011/0199395 A1 | 8/2011 | Nathan et al. |
| 2011/0227964 A1 | 9/2011 | Chaji et al. |
| 2011/0273399 A1 | 11/2011 | Lee |
| 2011/0279437 A1* | 11/2011 | Komiya .................. G09G 3/3233 345/212 |
| 2011/0293480 A1 | 12/2011 | Mueller |
| 2012/0056558 A1 | 3/2012 | Toshiya et al. |
| 2012/0062565 A1 | 3/2012 | Fuchs et al. |
| 2012/0082263 A1* | 4/2012 | Ebrahimi Tazeh Mahalleh ........... H04B 7/0669 375/299 |
| 2012/0262184 A1 | 10/2012 | Shen |
| 2012/0299978 A1 | 11/2012 | Chaji |
| 2013/0027381 A1 | 1/2013 | Nathan et al. |
| 2013/0057595 A1 | 3/2013 | Nathan et al. |
| 2013/0112960 A1 | 5/2013 | Chaji et al. |
| 2013/0135272 A1 | 5/2013 | Park |
| 2013/0201223 A1 | 8/2013 | Li |
| 2013/0309821 A1 | 11/2013 | Yoo et al. |
| 2013/0321671 A1 | 12/2013 | Cote et al. |
| 2014/0055500 A1* | 2/2014 | Lai .................. G09G 3/3208 345/690 |
| 2014/0062978 A1* | 3/2014 | Shin .................. G09G 3/3291 345/204 |
| 2014/0143126 A1* | 5/2014 | Malik .................. G06Q 40/025 705/38 |
| 2014/0146071 A1* | 5/2014 | Kim .................. G09G 3/3225 345/589 |

FOREIGN PATENT DOCUMENTS

| | | |
|---|---|---|
| CA | 2 249 592 | 7/1998 |
| CA | 2 368 386 | 9/1999 |
| CA | 2 242 720 | 1/2000 |
| CA | 2 354 018 | 6/2000 |
| CA | 2 432 530 | 7/2002 |
| CA | 2 436 451 | 8/2002 |
| CA | 2 438 577 | 8/2002 |
| CA | 2 463 653 | 1/2004 |
| CA | 2 498 136 | 3/2004 |
| CA | 2 522 396 | 11/2004 |
| CA | 2 443 206 | 3/2005 |
| CA | 2 472 671 | 12/2005 |
| CA | 2 567 076 | 1/2006 |
| CA | 2 526 782 | 4/2006 |
| CA | 2 541 531 | 7/2006 |
| CA | 2 550 102 | 4/2008 |
| CA | 2 773 699 | 10/2013 |
| CN | 1381032 | 11/2002 |
| CN | 1448908 | 10/2003 |
| CN | 1682267 A | 10/2005 |
| CN | 1760945 | 4/2006 |
| CN | 1886774 | 12/2006 |
| CN | 102656621 | 9/2012 |
| EP | 0 158 366 | 10/1985 |
| EP | 1 028 471 | 8/2000 |
| EP | 1 111 577 | 6/2001 |
| EP | 1 130 565 A1 | 9/2001 |
| EP | 1 194 013 | 4/2002 |
| EP | 1 335 430 A1 | 8/2003 |
| EP | 1 372 136 | 12/2003 |
| EP | 1 381 019 | 1/2004 |
| EP | 1 418 566 | 5/2004 |
| EP | 1 429 312 A | 6/2004 |
| EP | 145 0341 A | 8/2004 |
| EP | 1 465 143 A | 10/2004 |
| EP | 1 469 448 A | 10/2004 |
| EP | 1 521 203 A2 | 4/2005 |
| EP | 1 594 347 | 11/2005 |
| EP | 1 784 055 A2 | 5/2007 |
| EP | 1854338 A1 | 11/2007 |
| EP | 1 879 169 A1 | 1/2008 |
| EP | 1 879 172 | 1/2008 |
| GB | 2 389 951 | 12/2003 |
| JP | 1272298 | 10/1989 |
| JP | 4-042619 | 2/1992 |
| JP | 6-314977 | 11/1994 |
| JP | 8-340243 | 12/1996 |
| JP | 09-090405 | 4/1997 |
| JP | 10-254410 | 9/1998 |
| JP | 11-202295 | 7/1999 |
| JP | 11-219146 | 8/1999 |
| JP | 11 231805 | 8/1999 |
| JP | 11-282419 | 10/1999 |
| JP | 2000-056847 | 2/2000 |
| JP | 2000-81607 | 3/2000 |
| JP | 2001-134217 | 5/2001 |
| JP | 2001-195014 | 7/2001 |
| JP | 2002-055654 | 2/2002 |
| JP | 2002-91376 | 3/2002 |
| JP | 2002-514320 | 5/2002 |
| JP | 2002-278513 | 9/2002 |
| JP | 2002-333862 | 11/2002 |
| JP | 2003-076331 | 3/2003 |
| JP | 2003-124519 | 4/2003 |
| JP | 2003-177709 | 6/2003 |
| JP | 2003-271095 | 9/2003 |
| JP | 2003-308046 | 10/2003 |
| JP | 2003-317944 | 11/2003 |
| JP | 2004-004675 | 1/2004 |
| JP | 2004-145197 | 5/2004 |
| JP | 2004-287345 | 10/2004 |
| JP | 2005-057217 | 3/2005 |
| JP | 2007-065015 | 3/2007 |
| JP | 2008-102335 | 5/2008 |
| JP | 4-158570 | 10/2008 |
| KR | 2004-0100887 | 12/2004 |
| TW | 342486 | 10/1998 |

(56) References Cited

FOREIGN PATENT DOCUMENTS

| | | |
|---|---|---|
| TW | 473622 | 1/2002 |
| TW | 485337 | 5/2002 |
| TW | 502233 | 9/2002 |
| TW | 538650 | 6/2003 |
| TW | 1221268 | 9/2004 |
| TW | 1223092 | 11/2004 |
| TW | 200727247 | 7/2007 |
| WO | WO 1998/48403 | 10/1998 |
| WO | WO 1999/48079 | 9/1999 |
| WO | WO 2001/06484 | 1/2001 |
| WO | WO 2001/27910 A1 | 4/2001 |
| WO | WO 2001/63587 A2 | 8/2001 |
| WO | WO 2002/067327 A | 8/2002 |
| WO | WO 2003/001496 A1 | 1/2003 |
| WO | WO 2003/034389 A | 4/2003 |
| WO | WO 2003/058594 A1 | 7/2003 |
| WO | WO 2003/063124 | 7/2003 |
| WO | WO 2003/077231 | 9/2003 |
| WO | WO 2004/003877 | 1/2004 |
| WO | WO 2004/025615 A | 3/2004 |
| WO | WO 2004/034364 | 4/2004 |
| WO | WO 2004/047058 | 6/2004 |
| WO | WO 2004/104975 A1 | 12/2004 |
| WO | WO 2005/022498 | 3/2005 |
| WO | WO 2005/022500 A | 3/2005 |
| WO | WO 2005/029455 | 3/2005 |
| WO | WO 2005/029456 | 3/2005 |
| WO | WO 2005/055185 | 6/2005 |
| WO | WO 2006/000101 A1 | 1/2006 |
| WO | WO 2006/053424 | 5/2006 |
| WO | WO 2006/063448 A | 6/2006 |
| WO | WO 2007/003877 A | 1/2007 |
| WO | WO 2007/079572 | 7/2007 |
| WO | WO 2007/120849 A2 | 10/2007 |
| WO | WO 2009/048618 | 4/2009 |
| WO | WO 2009/055920 | 5/2009 |
| WO | WO 2010/023270 | 3/2010 |
| WO | WO 2011/041224 A1 | 4/2011 |
| WO | WO 2011/064761 A1 | 6/2011 |
| WO | WO 2011/067729 | 6/2011 |
| WO | WO 2012/160424 A1 | 11/2012 |
| WO | WO 2012/160471 | 11/2012 |
| WO | WO 2012/164474 A2 | 12/2012 |
| WO | WO 2012/164475 A2 | 12/2012 |

OTHER PUBLICATIONS

Alexander et al.: "Pixel circuits and drive schemes for glass and elastic AMOLED displays"; dated Jul. 2005 (9 pages).
Alexander et al.: "Unique Electrical Measurement Technology for Compensation, Inspection, and Process Diagnostics of AMOLED HDTV"; dated May 2010 (4 pages).
Ashtiani et al.: "AMOLED Pixel Circuit With Electronic Compensation of Luminance Degradation"; dated Mar. 2007 (4 pages).
Chaji et al.: "A Current-Mode Comparator for Digital Calibration of Amorphous Silicon AMOLED Displays"; dated Jul. 2008 (5 pages).
Chaji et al.: "A fast settling current driver based on the CCII for AMOLED displays"; dated Dec. 2009 (6 pages).
Chaji et al.: "A Low-Cost Stable Amorphous Silicon AMOLED Display with Full V~T- and V~O~L~E~D Shift Compensation"; dated May 2007 (4 pages).
Chaji et al.: "A low-power driving scheme for a-Si:H active-matrix organic light-emitting diode displays"; dated Jun. 2005 (4 pages).
Chaji et al.: "A low-power high-performance digital circuit for deep submicron technologies"; dated Jun. 2005 (4 pages).
Chaji et al.: "A novel a-Si:H AMOLED pixel circuit based on short-term stress stability of a-Si:H TFTs"; dated Oct. 2005 (3 pages).
Chaji et al.: "A Novel Driving Scheme and Pixel Circuit for AMOLED Displays"; dated Jun. 2006 (4 pages).
Chaji et al.: "A Novel Driving Scheme for High Resolution Large-area a-Si:H AMOLED displays"; dated Aug. 2005 (3 pages).
Chaji et al.: "A Stable Voltage-Programmed Pixel Circuit for a-Si:H AMOLED Displays"; dated Dec. 2006 (12 pages).
Chaji et al.: "A Sub-µA fast-settling current-programmed pixel circuit for AMOLED displays"; dated Sep. 2007.
Chaji et al.: "An Enhanced and Simplified Optical Feedback Pixel Circuit for AMOLED Displays"; dated Oct. 2006.
Chaji et al.: "Compensation technique for DC and transient instability of thin film transistor circuits for large-area devices"; dated Aug. 2008.
Chaji et al.: "Driving scheme for stable operation of 2-TFT a-Si AMOLED pixel"; dated Apr. 2005 (2 pages).
Chaji et al.: "Dynamic-effect compensating technique for stable a-Si:H AMOLED displays"; dated Aug. 2005 (4 pages).
Chaji et al.: "Electrical Compensation of OLED Luminance Degradation"; dated Dec. 2007 (3 pages).
Chaji et al.: "eUTDSP: a design study of a new VLIW-based DSP architecture"; dated My 2003 (4 pages).
Chaji et al.: "Fast and Offset-Leakage Insensitive Current-Mode Line Driver for Active Matrix Displays and Sensors"; dated Feb. 2009 (8 pages).
Chaji et al.: "High Speed Low Power Adder Design With a New Logic Style: Pseudo Dynamic Logic (SDL)"; dated Oct. 2001 (4 pages).
Chaji et al.: "High-precision, fast current source for large-area current-programmed a-Si flat panels"; dated Sep. 2006 (4 pages).
Chaji et al.: "Low-Cost AMOLED Television with IGNIS Compensating Technology"; dated May 2008 (4 pages).
Chaji et al.: "Low-Cost Stable a-Si:H AMOLED Display for Portable Applications"; dated Jun. 2006 (4 pages).
Chaji et al.: "Low-Power Low-Cost Voltage-Programmed a-Si:H AMOLED Display"; dated Jun. 2008 (5 pages).
Chaji et al.: "Merged phototransistor pixel with enhanced near infrared response and flicker noise reduction for biomolecular imaging"; dated Nov. 2008 (3 pages).
Chaji et al.: "Parallel Addressing Scheme for Voltage-Programmed Active-Matrix OLED Displays"; dated May 2007 (6 pages).
Chaji et al.: "Pseudo dynamic logic (SDL): a high-speed and low-power dynamic logic family"; dated 2002 (4 pages).
Chaji et al.: "Stable a-Si:H circuits based on short-term stress stability of amorphous silicon thin film transistors"; dated May 2006 (4 pages).
Chaji et al.: "Stable Pixel Circuit for Small-Area High- Resolution a-Si:H AMOLED Displays"; dated Oct. 2008 (6 pages).
Chaji et al.: "Stable RGBW AMOLED display with OLED degradation compensation using electrical feedback"; dated Feb. 2010 (2 pages).
Chaji et al.: "Thin-Film Transistor Integration for Biomedical Imaging and AMOLED Displays"; dated 2008 (177 pages).
European Search Report for Application No. EP 01 11 22313 dated Sep. 14, 2005 (4 pages).
European Search Report for Application No. EP 04 78 6661 dated Mar. 9, 2009.
European Search Report for Application No. EP 05 75 9141 dated Oct. 30, 2009 (2 pages).
European Search Report for Application No. EP 05 81 9617 dated Jan. 30, 2009.
European Search Report for Application No. EP 06 70 5133 dated Jul. 18, 2008.
European Search Report for Application No. EP 06 72 1798 dated Nov. 12, 2009 (2 pages).
European Search Report for Application No. EP 07 71 0608.6 dated Mar. 19, 2010 (7 pages).
European Search Report for Application No. EP 07 71 9579 dated May 20, 2009.
European Search Report for Application No. EP 07 81 5784 dated Jul. 20, 2010 (2 pages).
European Search Report for Application No. EP 10 16 6143, dated Sep. 3, 2010 (2 pages).
European Search Report for Application No. EP 10 83 4294.0-1903, dated Apr. 8, 2013, (9 pages).
European Search Report for Application No. PCT/CA2006/000177 dated Jun. 2, 2006.

(56) References Cited

OTHER PUBLICATIONS

European Supplementary Search Report for Application No. EP 04 78 6662 dated Jan. 19, 2007 (2 pages).
Extended European Search Report for Application No. 11 73 9485.8 dated Aug. 6, 2013(14 pages).
Extended European Search Report for Application No. EP 09 73 3076.5, dated Apr. 27, (13 pages).
Extended European Search Report for Application No. EP 11 16 8677.0, dated Nov. 29, 2012, (13 page).
Extended European Search Report for Application No. EP 11 19 1641.7 dated Jul. 11, 2012 (14 pages).
Fossum, Eric R.. "Active Pixel Sensors: Are CCD's Dinosaurs?" SPIE: Symposium on Electronic Imaging. Feb. 1, 1993 (13 pages).
Goh et al., "A New a-Si:H Thin-Film Transistor Pixel Circuit for Active-Matrix Organic Light-Emitting Diodes", IEEE Electron Device Letters, vol. 24, No. 9, Sep. 2003, pp. 583-585.
International Preliminary Report on Patentability for Application No. PCT/CA2005/001007 dated Oct. 16, 2006, 4 pages.
International Search Report for Application No. PCT/CA2004/001741 dated Feb. 21, 2005.
International Search Report for Application No. PCT/CA2004/001742, Canadian Patent Office, dated Feb. 21, 2005 (2 pages).
International Search Report for Application No. PCT/CA2005/001007 dated Oct. 18, 2005.
International Search Report for Application No. PCT/CA2005/001897, dated Mar. 21, 2006 (2 pages).
International Search Report for Application No. PCT/CA2007/000652 dated Jul. 25, 2007.
International Search Report for Application No. PCT/CA2009/000501, dated Jul. 30, 2009 (4 pages).
International Search Report for Application No. PCT/CA2009/001769, dated Apr. 8, 2010 (3 pages).
International Search Report for Application No. PCT/IB2010/055481, dated Apr. 7, 2011, 3 pages.
International Search Report for Application No. PCT/IB2010/055486, dated Apr. 19, 2011, 5 pages.
International Search Report for Application No. PCT/IB2010/055541 filed Dec. 1, 2010, dated May 26, 2011; 5 pages.
International Search Report for Application No. PCT/IB2011/050502, dated Jun. 27, 2011 (6 pages).
International Search Report for Application No. PCT/IB2011/051103, dated Jul. 8, 2011, 3 pages.
International Search Report for Application No. PCT/IB2011/055135, Canadian Patent Office, dated Apr. 16, 2012 (5 pages).
International Search Report for Application No. PCT/IB2012/052372, dated Sep. 12, 2012 (3 pages).
International Search Report for Application No. PCT/IB2013/054251, Canadian Intellectual Property Office, dated Sep. 11, 2013; (4 pages).
International Search Report for Application No. PCT/JP02/09668, dated Dec. 3, 2002, (4 pages).
International Written Opinion for Application No. PCT/CA2004/001742, Canadian Patent Office, dated Feb. 21, 2005 (5 pages).
International Written Opinion for Application No. PCT/CA2005/001897, dated Mar. 21, 2006 (4 pages).
International Written Opinion for Application No. PCT/CA2009/000501 dated Jul. 30, 2009 (6 pages).
International Written Opinion for Application No. PCT/IB2010/055481, dated Apr. 7, 2011, 6 pages.
International Written Opinion for Application No. PCT/IB2010/055486, dated Apr. 19, 2011, 8 pages.
International Written Opinion for Application No. PCT/IB2010/055541, dated May 26, 2011; 6 pages.
International Written Opinion for Application No. PCT/IB2011/050502, dated Jun. 27, 2011 (7 pages).
International Written Opinion for Application No. PCT/IB2011/051103, dated Jul. 8, 2011, 6 pages.
International Written Opinion for Application No. PCT/IB2011/055135, Canadian Patent Office, dated Apr. 16, 2012 (5 pages).

International Written Opinion for Application No. PCT/IB2012/052372, dated Sep. 12, 2012 (6 pages).
International Written Opinion for Application No. PCT/IB2013/054251, Canadian Intellectual Property Office, dated Sep. 11, 2013; (5 pages).
International Written Opinion for Application No. PCT/IB2014/060879, Canadian Intellectual Property Office, dated Jul. 17, 2014; (4 pages).
Jafarabadiashtiani et al.: "A New Driving Method for a-Si AMOLED Displays Based on Voltage Feedback"; dated 2005 (4 pages).
Kanicki, J., et al. "Amorphous Silicon Thin-Film Transistors Based Active-Matrix Organic Light-Emitting Displays." Asia Display: International Display Workshops, Sep. 2001 (pp. 315-318).
Karim, K. S., et al. "Amorphous Silicon Active Pixel Sensor Readout Circuit for Digital Imaging." IEEE: Transactions on Electron Devices. vol. 50, No. 1, Jan. 2003 (pp. 200-208).
Lee et al.: "Ambipolar Thin-Film Transistors Fabricated by PECVD Nanocrystalline Silicon"; dated 2006.
Lee, Wonbok: "Thermal Management in Microprocessor Chips and Dynamic Backlight Control in Liquid Crystal Displays", Ph.D. Dissertation, University of Southern California (124 pages).
Ma E Y et al.: "Organic light emitting diode/thin film transistor integration for foldable displays" dated Sep. 15, 1997(4 pages).
Matsueda y et al.: "35.1: 2.5-in. AMOLED with Integrated 6-bit Gamma Compensated Digital Data Driver"; dated May 2004.
Mendes E., et al. "A High Resolution Switch-Current Memory Base Cell." IEEE: Circuits and Systems. vol. 2, Aug. 1999 (pp. 718-721).
Nathan A. et al., "Thin Film imaging technology on glass and plastic" ICM 2000, proceedings of the 12 international conference on microelectronics, dated Oct. 31, 2001 (4 pages).
Nathan et al., "Amorphous Silicon Thin Film Transistor Circuit Integration for Organic LED Displays on Glass and Plastic", IEEE Journal of Solid-State Circuits, vol. 39, No. 9, Sep. 2004, pp. 1477-1486.
Nathan et al.: "Backplane Requirements for active Matrix Organic Light Emitting Diode Displays,"; dated 2006 (16 pages).
Nathan et al.: "Call for papers second international workshop on compact thin-film transistor (TFT) modeling for circuit simulation"; dated Sep. 2009 (1 page).
Nathan et al.: "Driving schemes for a-Si and LTPS AMOLED displays"; dated Dec. 2005 (11 pages).
Nathan et al.: "Invited Paper: a-Si for AMOLED—Meeting the Performance and Cost Demands of Display Applications (Cell Phone to HDTV)"; dated 2006 (4 pages).
Office Action in Japanese patent application No. JP2006-527247 dated Mar. 15, 2010. (8 pages).
Office Action in Japanese patent application No. JP2007-545796 dated Sep. 5, 2011. (8 pages).
Office Action in Japanese patent application No. JP2012-541612 dated Jul. 15, 2014. (3 pages).
Partial European Search Report for Application No. EP 11 168 677.0, dated Sep. 22, 2011 (5 pages).
Partial European Search Report for Application No. EP 11 19 1641.7, dated Mar. 20, 2012 (8 pages).
Philipp: "Charge transfer sensing" Sensor Review, vol. 19, No. 2, Dec. 31, 1999, (Dec. 31, 1999), 10 pages.
Rafati et al.: "Comparison of a 17 b multiplier in Dual-rail domino and in Dual-rail D L (D L) logic styles"; dated 2002 (4 pages).
Safavian et al.: "3-TFT active pixel sensor with correlated double sampling readout circuit for real-time medical x-ray imaging"; dated Jun. 2006 (4 pages).
Safavian et al.: "A novel current scaling active pixel sensor with correlated double sampling readout circuit for real time medical x-ray imaging"; dated May 2007 (7 pages).
Safavian et al.: "A novel hybrid active-passive pixel with correlated double sampling CMOS readout circuit for medical x-ray imaging"; dated May 2008 (4 pages).
Safavian et al.: "Self-compensated a-Si:H detector with current-mode readout circuit for digital X-ray fluoroscopy"; dated Aug. 2005 (4 pages).

(56) References Cited

OTHER PUBLICATIONS

Safavian et al.: "TFT active image sensor with current-mode readout circuit for digital x-ray fluoroscopy [5969D-82]"; dated Sep. 2005 (9 pages).
Safavian et al.: "Three-TFT image sensor for real-time digital X-ray imaging"; dated Feb. 2, 2006 (2 pages).
Search Report for Taiwan Invention Patent Application No. 093128894 dated May 1, 2012. (1 page).
Search Report for Taiwan Invention Patent Application No. 94144535 dated Nov. 1, 2012. (1 page).
Singh, et al., "Current Conveyor: Novel Universal Active Block", Samriddhi, S-JPSET vol. I, Issue 1, 2010, pp. 41-48 (12EPPT).
Smith, Lindsay I., "A tutorial on Principal Components Analysis," dated Feb. 26, 2001 (27 pages).
Spindler et al., System Considerations for RGBW OLED Displays, Journal of the SID 14/1, 2006, pp. 37-48.
Stewart M. et al., "Polysilicon TFT technology for active matrix oled displays" IEEE transactions on electron devices, vol. 48, No. 5, dated May 2001 (7 pages).
Vygranenko et al.: "Stability of indium-oxide thin-film transistors by reactive ion beam assisted deposition"; dated 2009.
Wang et al.: "Indium oxides by reactive ion beam assisted evaporation: From material study to device application"; dated Mar. 2009 (6 pages).
Yi He et al., "Current-Source a-Si:H Thin Film Transistor Circuit for Active-Matrix Organic Light-Emitting Displays", IEEE Electron Device Letters, vol. 21, No. 12, Dec. 2000, pp. 590-592.
Yu, Jennifer: "Improve OLED Technology for Display", Ph.D. Dissertation, Massachusetts Institute of Technology, Sep. 2008 (151 pages).
International Search Report for Application No. PCT/IB2014/058244, Canadian Intellectual Property Office, dated Apr. 11, 2014; (6 pages).
International Search Report for Application No. PCT/IB2014/059753, Canadian Intellectual Property Office, dated Jun. 23, 2014; (6 pages).
Written Opinion for Application No. PCT/IB2014/059753, Canadian Intellectual Property Office, dated Jun. 12, 2014 (6 pages).
Written Opinion for Application No. PCT/IB2014/060879, Canadian Intellectual Property Office, dated Jul. 17, 2014 (3 pages).
Extended European Search Report for Application No. EP 14158051.4, dated Jul. 29, 2014, (4 pages).
Office Action in Chinese Patent Invention No. 201180008188.9, dated Jun. 4, 2014 (17 pages) (w/English translation).
International Search Report corresponding to International Application No. PCT/IB2014/063854, dated Dec. 9, 2014 (6 pages).
Written Opinion of the International Searching Authority corresponding to International Application No. PCT/IB2014/063854, dated Dec. 9, 2014 (8 pages).

\* cited by examiner

COMPENSATION ACCURACY

CROSS-REFERENCE TO RELATED APPLICATIONS

This application is a continuation of and claims priority to U.S. patent application Ser. No. 14/455,990, filed Aug. 11, 2014, now allowed, which claims the benefit of U.S. Provisional Patent Application No. 61/864,972, filed Aug. 12, 2013, each of which is hereby incorporated by reference herein in its entirety.

FIELD OF INVENTION

The present invention relates to display technology, and particularly to driving systems for active-matrix displays such as AMOLED displays.

BACKGROUND OF THE INVENTION

A display device having a plurality of pixels (or sub-pixels) arranged in a matrix has been widely used in various applications. Such a display device includes a panel having the pixels and peripheral circuits for controlling the panels. Typically, the pixels are defined by the intersections of scan lines and data lines, and the peripheral circuits include a gate driver for scanning the scan lines and a source driver for supplying image data to the data lines. The source driver may include a gamma correction circuit for controlling the gray scale of each pixel. In order to display a frame, the source driver and the gate driver respectively provide a data signal and a scan signal to the corresponding data line and the corresponding scan line. As a result, each pixel will display a predetermined brightness and color.

In recent years, the matrix display using organic light emitting devices (OLED) has been widely employed in small electronic devices, such as handheld devices, cellular phones, personal digital assistants (PDAs), and cameras because of the generally lower power consumed by such devices. However, the quality of output in an OLED based pixel is affected by the properties of a drive transistor that is typically fabricated from amorphous or poly silicon as well as the OLED itself. In particular, threshold voltage and mobility of the transistor tend to change as the pixel ages. Moreover, the performance of the drive transistor may be effected by temperature. In order to maintain image quality, these parameters must be compensated for by adjusting the programming voltage to pixels. Compensation via changing the programming voltage is more effective when a higher level of programming voltage and therefore higher luminance is produced by the OLED based pixels. However, luminance levels are largely dictated by the level of brightness for the image data to a pixel, and the desired higher levels of luminance for more effective compensation may not be achievable while within the parameters of the image data.

SUMMARY

According to one embodiment, a system is provided for using image data, representing images to be displayed in successive frames, to drive a display having pixels that include a drive transistor and an organic light emitting device. The system divides each frame into at least first and second sub-frames, supplies the image data during one of the sub-frames, supplies compensation data during the other of the sub-frames, compensates image data based on the compensation data, and supplying each pixel with a drive current that is based on the compensated image data during each frame. In one implementation, the compensated image data is supplied from a driver having a preselected data resolution, and the system determines whether the compensated image data is greater than the data resolution of the driver, and if the compensated image data is greater than the data resolution of the driver, transfers the excess compensated image data to a different sub-frame. The sub-frame supplied with image data may be longer than the sub-frame supplied with compensation data.

According to another embodiment, the system divides each frame into at least first and second sub-frames, divides compensation data among the sub-frames, compensates image data based on the compensation data, and supplies each pixel with a drive current that is based on the compensated image data during each frame. In one implementation, the compensation data is divided equally among the sub-frames, and any residue value is supplied to another sub-frame. The sub-frames may have different sizes.

According to a further embodiment, the system divides compensation data among a plurality of frames, compensates image data based on the compensation data in each frame, and supplies each pixel with a drive current that is based on the compensated image data during each frame. In one implementation, the value required for calibration is reduced from the total bits available in all frames.

BRIEF DESCRIPTION OF THE DRAWINGS

The foregoing and other advantages of the invention will become apparent upon reading the following detailed description and upon reference to the drawings.

DETAILED DESCRIPTION

Figure 1:
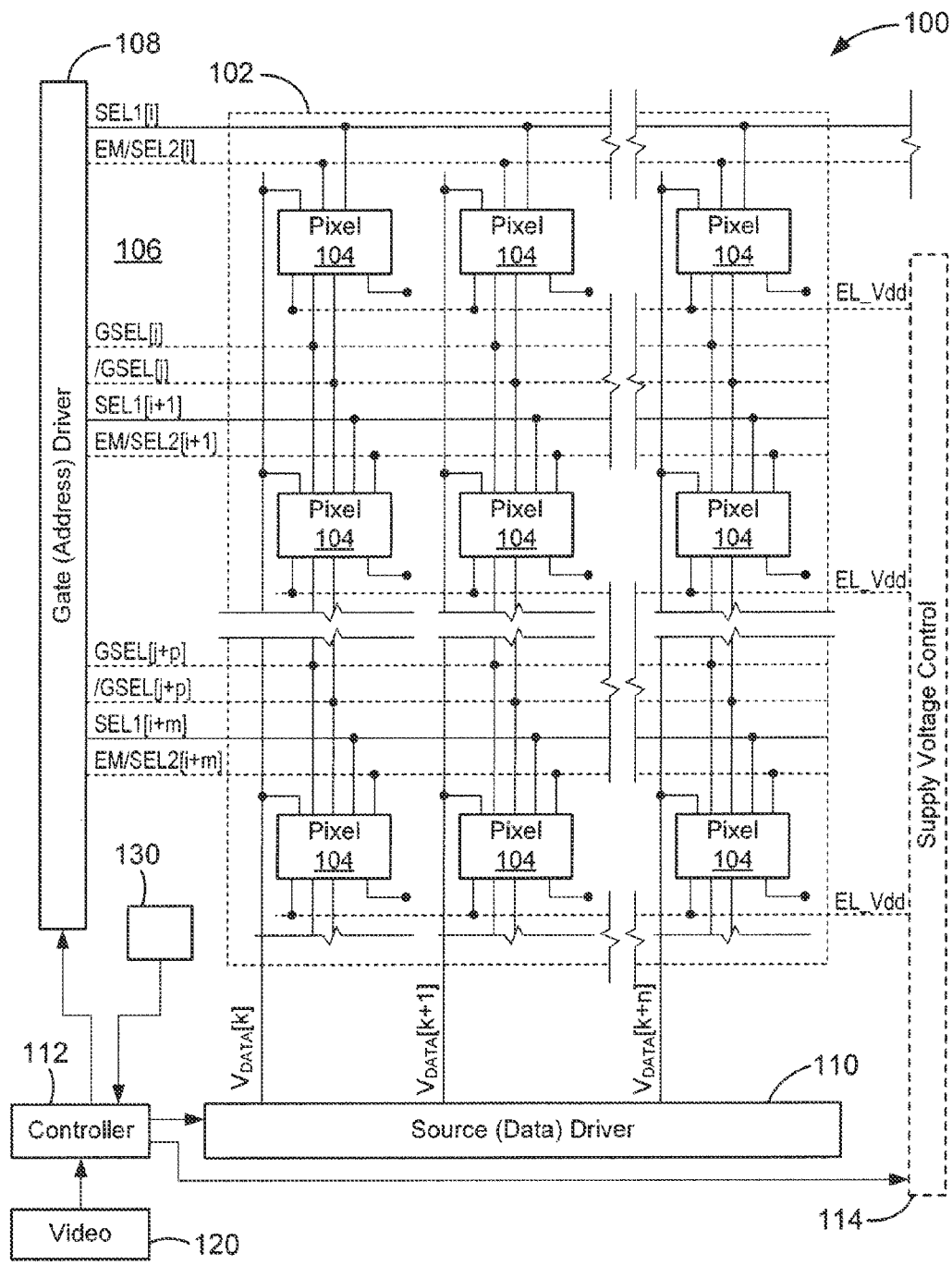
FIG. 1 is a block diagram of an AMOLED display system.

While the invention is susceptible to various modifications and alternative forms, specific embodiments have been shown by way of example in the drawings and will be described in detail herein. It should be understood, however, that the invention is not intended to be limited to the particular forms disclosed. Rather, the invention is to cover all modifications, equivalents, and alternatives falling within the spirit and scope of the invention as defined by the appended claims.

FIG. 1 is an electronic display system 100 having an active matrix area or pixel array 102 in which an array of pixels 104 are arranged in a row and column configuration. For ease of illustration, only three rows and columns are shown. External to the active matrix area of the pixel array 102 is a peripheral area 106 where peripheral circuitry for driving and controlling the pixel array 102 are disposed. The peripheral circuitry includes a gate or address driver circuit 108, a source or data driver circuit 110, a controller 112, and a supply voltage (e.g., Vdd) driver 114. The controller 112 controls the gate, source, and supply voltage drivers 108, 110, 114. The gate driver 108, under control of the controller 112, operates on address or select lines SEL[i], SEL[i+1], and so forth, one for each row of pixels 104 in the pixel array 102. A video source 120 feeds processed video data into the controller 112 for display on the display system 100. The video source 120 represents any video output from devices using the display system 100 such as a computer, cell phone, PDA and the like. The controller 112 converts the processed video data to the appropriate voltage programming information to the pixels 104 on the display system 100.

In pixel sharing configurations described below, the gate or address driver circuit 108 can also optionally operate on global select lines GSEL[j] and optionally/GSEL[j], which operate on multiple rows of pixels 104 in the pixel array 102, such as every three rows of pixels 104. The source driver circuit 110, under control of the controller 112, operates on voltage data lines Vdata[k], Vdata[k+1], and so forth, one for each column of pixels 104 in the pixel array 102. The voltage data lines carry voltage programming information to each pixel 104 indicative of a brightness (gray level) of each light emitting device in the pixel 104. A storage element, such as a capacitor, in each pixel 104 stores the voltage programming information until an emission or driving cycle turns on the light emitting device. The supply voltage driver 114, under control of the controller 112, controls the level of voltage on a supply voltage (EL_Vdd) line, one for each row of pixels 104 in the pixel array 102. Alternatively, the voltage driver 114 may individually control the level of supply voltage for each row of pixels 104 in the pixel array 102 or each column of pixels 104 in the pixel array 102.

As is known, each pixel 104 in the display system 100 needs to be programmed with information indicating the brightness (gray level) of the organic light emitting device (OLED) in the pixel 104 for a particular frame. A frame defines the time period that includes a programming cycle or phase during which each and every pixel in the display system 100 is programmed with a programming voltage indicative of a brightness and a driving or emission cycle or phase during which each light emitting device in each pixel is turned on to emit light at a brightness commensurate with the programming voltage stored in a storage element. A frame is thus one of many still images that compose a complete moving picture displayed on the display system 100. There are at least two schemes for programming and driving the pixels: row-by-row, or frame-by-frame. In row-by-row programming, a row of pixels is programmed and then driven before the next row of pixels is programmed and driven. In frame-by-frame programming, all rows of pixels in the display system 100 are programmed first, and all of the pixels are driven row-by-row. Either scheme can employ a brief vertical blanking time at the beginning or end of each frame during which the pixels are neither programmed nor driven.

The components located outside of the pixel array 102 can be disposed in a peripheral area 106 around the pixel array 102 on the same physical substrate on which the pixel array 102 is disposed. These components include the gate driver 108, the source driver 110 and the supply voltage controller 114. Alternatively, some of the components in the peripheral area can be disposed on the same substrate as the pixel array 102 while other components are disposed on a different substrate, or all of the components in the peripheral are can be disposed on a substrate different from the substrate on which the pixel array 102 is disposed. Together, the gate driver 108, the source driver 110, and the supply voltage control 114 make up a display driver circuit. The display driver circuit in some configurations can include the gate driver 108 and the source driver 110 but not the supply voltage controller 114.

The controller 112 includes internal memory (not shown) for various look up tables and other data for functions such as compensation for effects such as temperature, change in threshold voltage, change in mobility, etc. Unlike a convention AMOLED, the display system 100 allows the use of higher luminance of the pixels 104 during one part of the frame period while emitting no light in the other part of the frame period. The higher luminance during a limited portion of the frame period results in the required brightness from the pixel for a frame, but higher levels of luminance facilitate the compensation for changing parameters of the drive transistor performed by the controller 112. The system 100 also includes a light sensor 130 that is coupled to the controller 112. The light sensor 130 may be a single sensor located in proximity to the array 102 as in this example. Alternatively, the light sensor 130 may be multiple sensors such as one in each corner of the pixel array 102. Also, the light sensor 130 or multiple sensors may be embedded in the same substrate as the array 102, or have its own substrate on the array 102. As will be explained, the light sensor 130 allows adjustment of the overall brightness of the display system 100 according to ambient light conditions.

Figure 2:
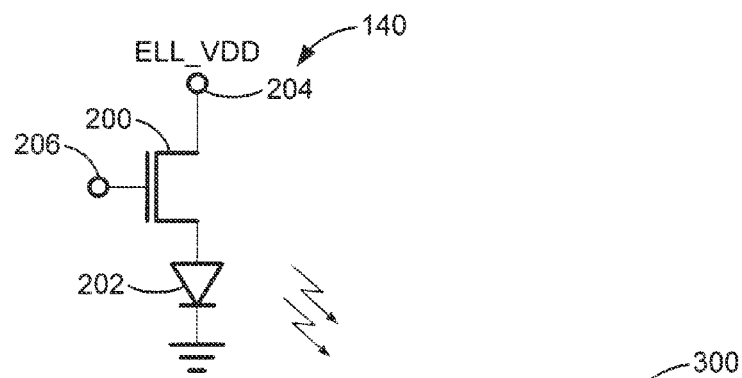
FIG. 2 is a block diagram of a pixel driver circuit for the AMOLED display in FIG. 1.

FIG. 2 is a circuit diagram of a simple individual driver circuit 200 for a pixel such as the pixel 104 in FIG. 1. As explained above, each pixel 104 in the pixel array 102 in FIG. 1 is driven by the driver circuit 200 in FIG. 2. The driver circuit 200 includes a drive transistor 202 coupled to an organic light emitting device (OLED) 204. In this example, the organic light emitting device 204 is fabricated from a luminous organic material which is activated by current flow and whose brightness is a function of the magnitude of the current. A supply voltage input 206 is coupled to the drain of the drive transistor 202. The supply voltage input 206 in conjunction with the drive transistor 202 creates current in the light emitting device 204. The current level may be controlled via a programming voltage input 208 coupled to the gate of the drive transistor 202. The programming voltage input 208 is therefore coupled to the source driver 110 in FIG. 1. In this example, the drive transistor 202 is a thin film transistor fabricated from hydrogenated amorphous silicon. Other circuit components (not shown) such as capacitors and transistors may be added to the simple driver circuit 200 to allow the pixel to operate with various enable, select and control signals such as those input by the gate driver 108 in FIG. 1. Such components are used for faster programming of the pixels, holding the programming of the pixel during different frames, and other functions.

Figure 3:
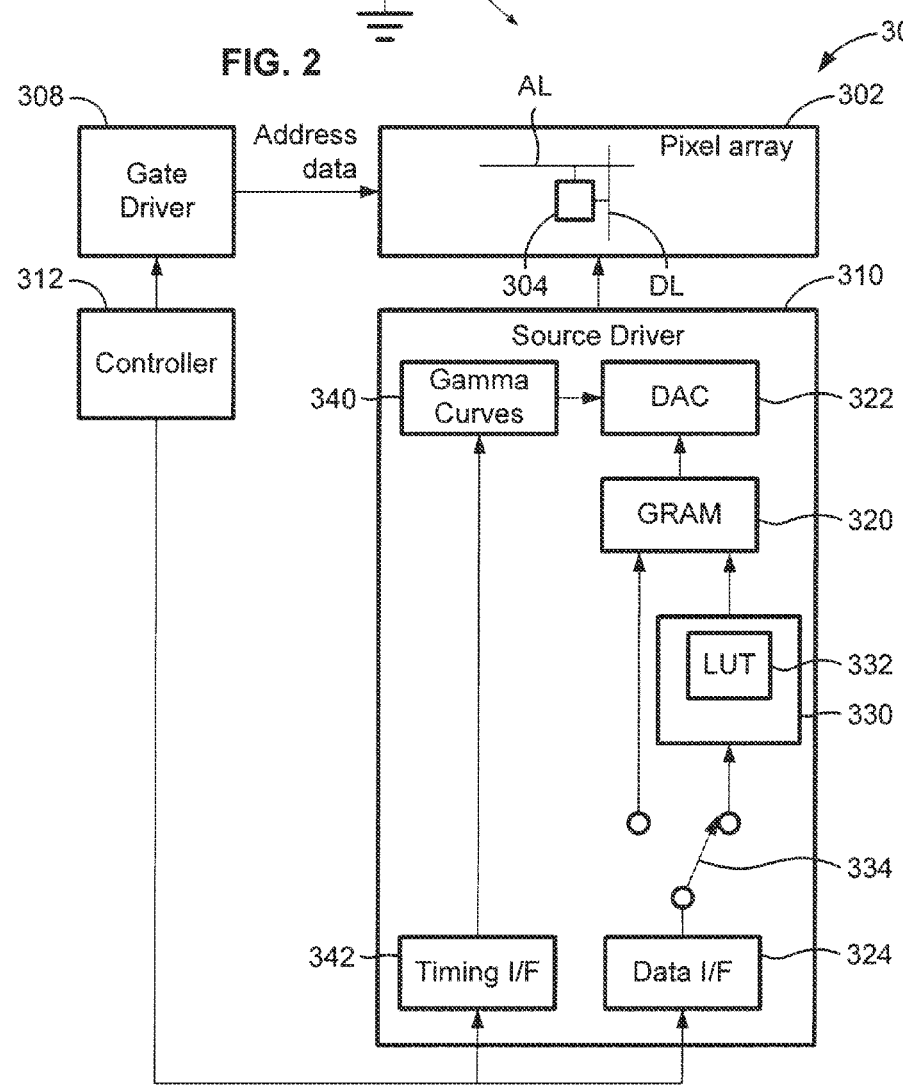
FIG. 3 is a block diagram similar to FIG. 1 but showing the source driver in more detail.
Figure 4A:
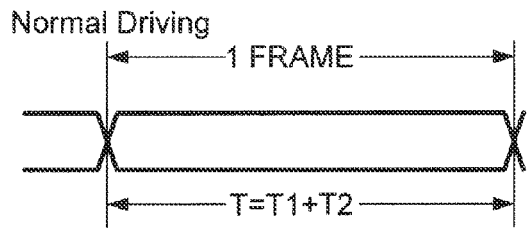
FIGS. 4A-4B are timing diagrams illustrating the time period of one complete frame and two sub-frame time periods within the complete frame time period.
Figure 4B:
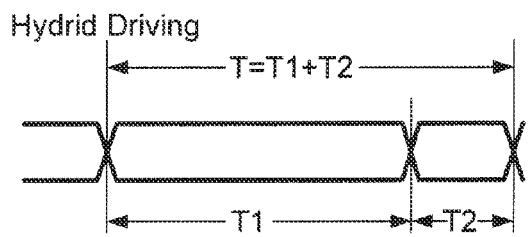

Referring to FIG. 3, there is illustrated the source driver 110 that supplies a data line voltage to a data line DL to program the selected pixels coupled to the data line DL. The controller 112 provides raw grayscale image data, at least one operation timing signal and a mode signal (hybrid or normal driving mode) to the source driver 110. Each of the gate driver 108 and the source driver 110 or a combination may be built from a one-chip semiconductor integrated circuit (IC) chip.

The source driver 110 includes a timing interface (I/F) 342, a data interface (I/F) 324, a gamma correction circuit 340, a processing circuit 330, a memory 320 and a digital-to-analog converter (DAC) 322. The memory 320 is, for example, a graphic random access memory (GRAM) for storing grayscale image data. The DAC 322 includes a decoder for converting grayscale image data read from the GRAM 320 to a voltage corresponding to the luminance at which it is desired to have the pixels emit light. The DAC 322 may be a CMOS digital-to-analog converter.

The source driver 110 receives raw grayscale image data via the data I/F 324, and a selector switch 326 determines whether the data is supplied directly to the GRAM 320, referred to as the normal mode, or to the processing circuit 330, referred to as the hybrid mode. The data supplied to the processing circuit 330 is converted from the typical 8-bit raw data to 9-bit hybrid data, e.g., by use of a hybrid Look-Up-Table (LUT) 332 stored in permanent memory which may be part of the processing circuit 330 or in a separate memory device such as ROM, EPROM, EEPROM, flash memory, etc. The extra bit indicates whether each grayscale number is located in a predetermined low grayscale range LG or a predetermined high grayscale HG.

The GRAM 320 supplies the DAC 322 with the raw 8-bit data in the normal driving mode and with the converted 9-bit data in the hybrid driving mode. The gamma correction circuit 340 supplies the DAC 322 with signals that indicate the desired gamma corrections to be executed by the DAC 322 as it converts the digital signals from the GRAM 320 to analog signals for the data lines DL. DACs that execute gamma corrections are well known in the display industry.

The operation of the source driver 110 is controlled by one or more timing signals supplied to the gamma correction circuit 340 from the controller 112 through the timing I/F 342. For example, the source driver 110 may be controlled to produce the same luminance according to the grayscale image data during an entire frame time T in the normal driving mode, and to produce different luminance levels during sub-frame time periods T1 and T2 in the hybrid driving mode to produce the same net luminance as in the normal driving mode.

In the hybrid driving mode, the processing circuit 330 converts or "maps" the raw grayscale data that is within a predetermined low grayscale range LG to a higher grayscale value so that pixels driven by data originating in either range are appropriately compensated to produce a uniform display during the frame time T. This compensation increases the luminance of pixels driven by data originating from raw grayscale image data in the low range LG, but the drive time of those pixels is reduced so that the average luminance of such pixels over the entire frame time T is at the desired level. Specifically, when the raw grayscale value is in a preselected high grayscale range HG, the pixel is driven to emit light during a major portion of the complete frame time period T, such as the portion ¾T depicted in FIG. 5(c). When the raw grayscale value is in the low range LG, the pixel is driven to emit light during a minor portion of the complete frame time period T, such as the portion ¼T depicted in FIG. 5(d), to reduce the frame time during which the increased voltage is applied.

Figure 5A:
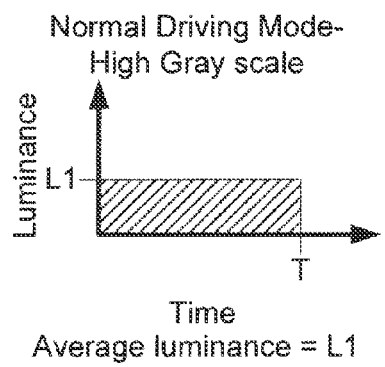
FIGS. 5A-5D are a series of diagrammatic illustrations of the luminance produced by one pixel within the time periods of FIG. 4 in two different driving modes and when driven by two different grayscale values.
Figure 5C:
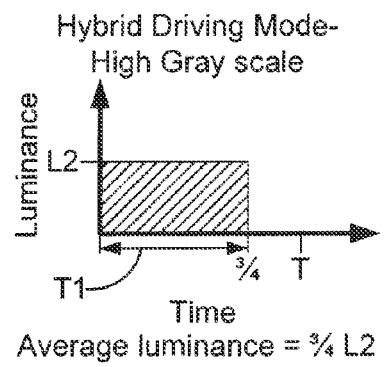
Figure 5B:
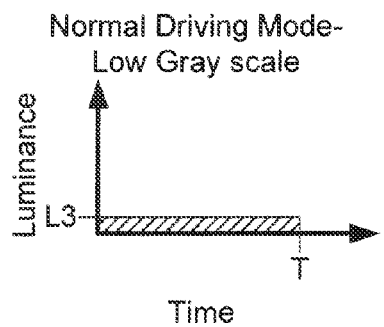
Figure 5D:
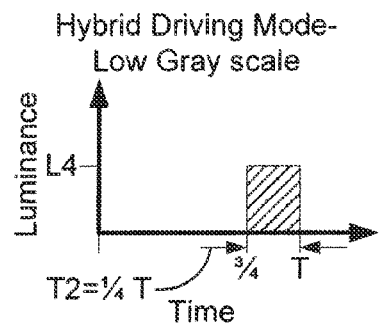
Figure 6:
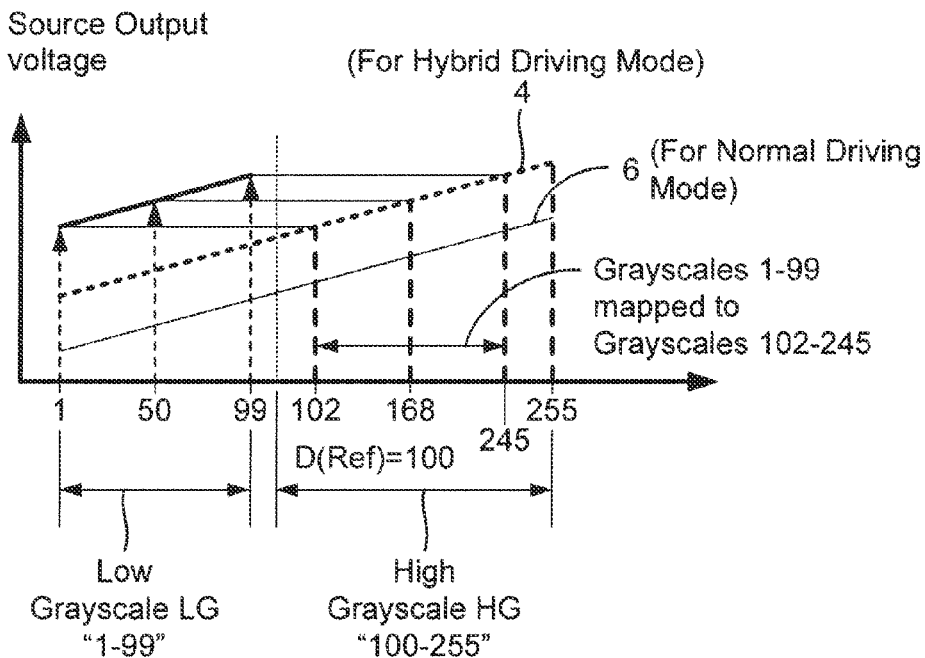
FIG. 6 is a graph illustrating two different gamma curves, for use in two different driving modes, for different grayscale values.

FIG. 6 illustrates an example in which raw grayscale values in a low range LG of 1-99 are mapped to corresponding values in a higher range of 102-245. In the hybrid driving mode, one frame is divided into two sub-frame time periods T1 and T2. The duration of one full frame is T, the duration of one sub-frame time period is T1=αT, and the duration of the other sub-frame time period is T2=(1−α)T, so T=T1+T2. In the example in FIG. 5, α=¾, and thus T1=(¾)T, and T2=(¼)T. The value of α is not limited to ¾ and may vary. As described below, raw grayscale data located in the low grayscale LG is transformed to high grayscale data for use in period T2. The operation timing of the sub-frame periods may be controlled by timing control signals supplied to the timing I/F 342. It is to be understood that more than two sub-frame time periods could be used by having different numbers of ranges of grayscales with different time periods assigned to each range.

In the example depicted in FIG. 5(a), L1 represents the average luminance produced during a frame period T for raw grayscale data located in the high grayscale range HG, when the normal drive mode is selected. In FIG. 5(b), L3 represents the average luminance produced during a frame period T for raw grayscale data located in the low grayscale range LG, in the normal drive mode. In FIG. 5(c), L2 represents the average luminance for raw grayscale data located in the high grayscale range HG, during the sub-frame period T1 when the hybrid drive mode is selected. In FIG. 5(d), L4 represents the average luminance for raw grayscale data located in the low grayscale range LG, during the sub-frame period T2 when the hybrid drive mode is selected. The average luminances produced over the entire frame period T by the sub-frame luminances depicted in FIGS. 5(c) and 5(d) are the same as those depicted in FIGS. 5 (a) and 5(b), respectively, because L2=4/3L1 and L4=4L3.

If the raw grayscale image data is located in the low grayscale range LG, the source driver 110 supplies the data line DL with a data line voltage corresponding to the black level ("0") in the sub-frame period T2. If the raw grayscale data is located in the high grayscale range HD, the source driver 110 supplies the data line DL with a data line voltage corresponding to the black level ("0") in the sub-frame period T1.

FIG. 6 illustrates the gamma corrections executed by the DAC 322 in response to the control signals supplied to the DAC 322 by the gamma correction circuit 340. The source driver 110 uses a first gamma curve 4 for gamma correction in the hybrid driving mode, and a second gamma curve 6 for gamma correction in the normal driving mode. In the hybrid driving mode, values in the low range LG are converted to higher grayscale values, and then both those converted values and the raw grayscale values that fall within the high range HG are gamma-corrected according to the same gamma curve 4. The gamma-corrected values are output from the DAC 322 to the data lines DL and used as the drive signals for the pixels 104, with the gamma-corrected high-range values driving their pixels in the first sub-frame time period T1, and the converted and gamma-corrected low-range values driving their pixels in the second sub-frame time period T2.

In the normal driving mode, all the raw grayscale values are gamma-corrected according to a second gamma curve 6. It can be seen from FIG. 6 that the gamma curve 4 used in the hybrid driving mode yields higher gamma-corrected values than the curve 6 used in the normal driving mode. The higher values produced in the hybrid driving mode compensate for the shorter driving times during the sub-frame periods T1 and T2 used in that mode.

The display system 100 divides the grayscales into a low grayscale range LG and a high grayscale range HG. Specifically, if the raw grayscale value of a pixel is greater than or equal to a reference value D(ref), that data is considered as the high grayscale range HG. If the raw grayscale value is smaller than the reference value D(ref), that data is considered as the low grayscale range LG.

Figure 7:
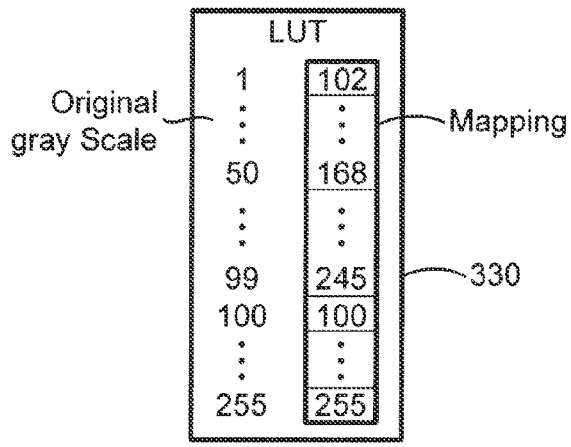
FIG. 7 is an illustration of exemplary values used to map grayscale data falling within a preselected low range to higher grayscale values.

In the example illustrated in FIG. 6, the reference value D(ref) is set to 100. The grayscale transformation is implemented by using the hybrid LUT 132 of FIG. 1, as illustrated in FIGS. 6 and 7. One example of the hybrid LUT 132 is shown in FIG. 7 where the grayscale values 1-99 in the low grayscale range LG are mapped to the grayscale values 102-245 in the high grayscale range HG.

Assuming that raw grayscale data from the controller 112 is 8-bit data, 8-bit grayscale data is provided for each color (e.g., R, G, B etc) and is used to drive the sub-pixels having those colors. The GRAM 320 stores the data in 9-bit words for the 8-bit grayscale data plus the extra bit added to indicate whether the 8-bit value is in the low or high grayscale range.

Figure 9:
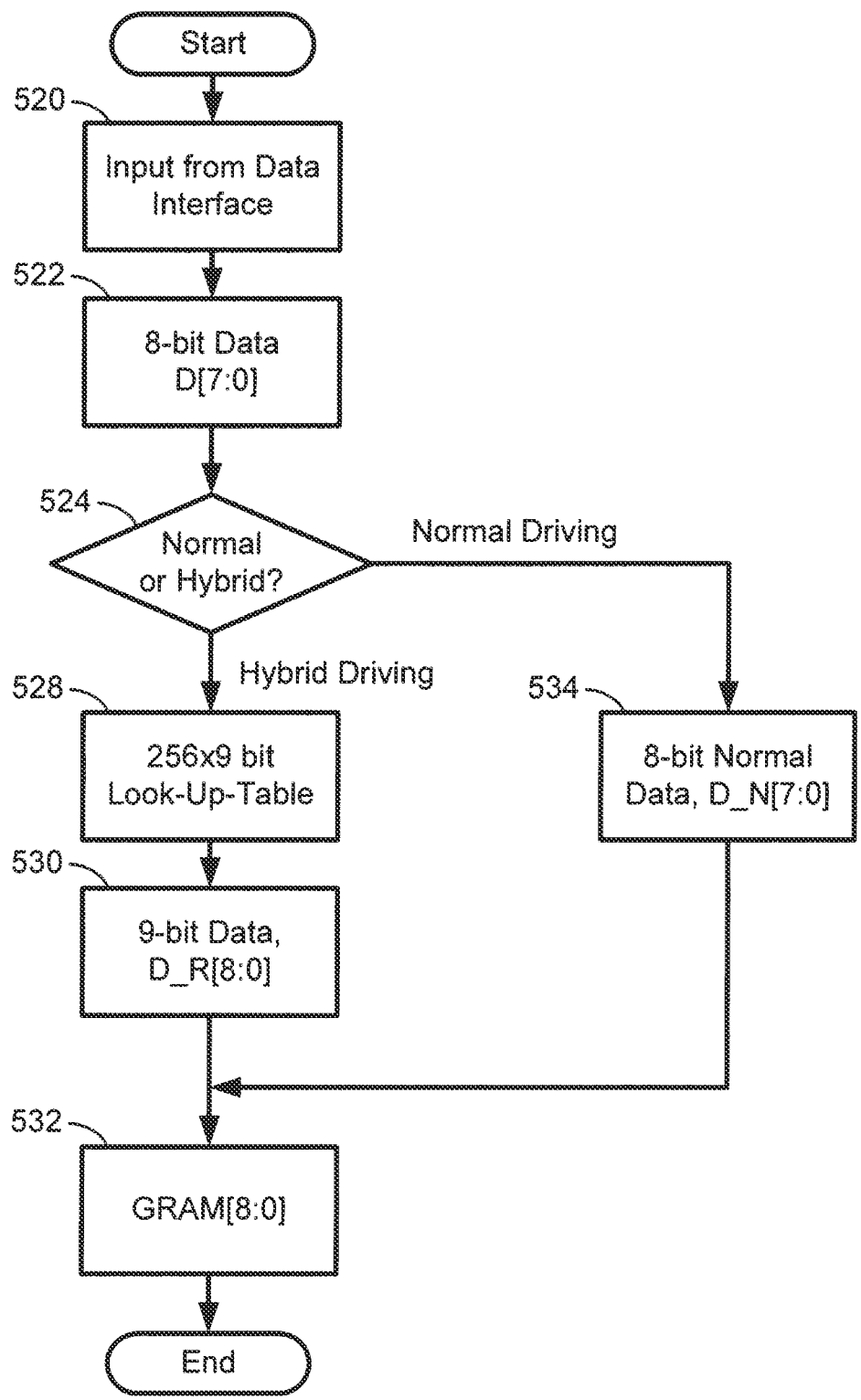
FIG. 9 is a flow chart of a process executed by the source driver to convert raw grayscale image data that falls within a low range, to higher grayscale values.

In the flow chart of FIG. 9, data in the GRAM 320 is depicted as the nine bit word GRAM[8:0], with the bit GRAM[8] indicating whether the grayscale data is located in the high grayscale range HG or the low grayscale range LG. In the hybrid driving mode, all the input data from the data I/F 124 is divided into two kinds of 8-bit grayscale data, as follows:

1. If the raw input data is in the 8 bits of high grayscale range, local data D[8] is set to be "1" (D[8]=1), and the 8 bits of the local data D[7:0] is the raw grayscale data. The local data D[8:0] is saved as GRAM[8:0] in GRAM 320 where GRAM[8]=1.
2. If the raw input data is in the low grayscale LG, local data D[8] is set to be "0" (D[8]=0), and local data D[7:0] is obtained from the hybrid LUT 332. The local data D[8:0] is saved as GRAM[8:0] in GRAM 320

FIG. 9 is a flow chart of one example of an operation for storing 8-bit grayscale data into the GRAM 320 as a 9-bit GRAM data word. The operation is implemented in the processing circuit 330 in the source driver 110. Raw grayscale data is input from the data I/F 124 at step 520, providing 8-bit data at step 522. The processing circuit 330 determines the system mode, i.e., normal driving mode or hybrid driving mode, at step 524. If the system mode is the hybrid driving mode, the system uses the 256*9 bit LUT 132 at step 528 to provide 9-bit data D_R[8:0] at step 530, including the one-bit range indicator. This data is stored in the GRAM 320 at step 532. If the system mode is the normal driving mode, the system uses the raw 8-bit input data D_N[7:0] at step 534, and stores the data in the GRAM 320 at step 532.

Figure 8:
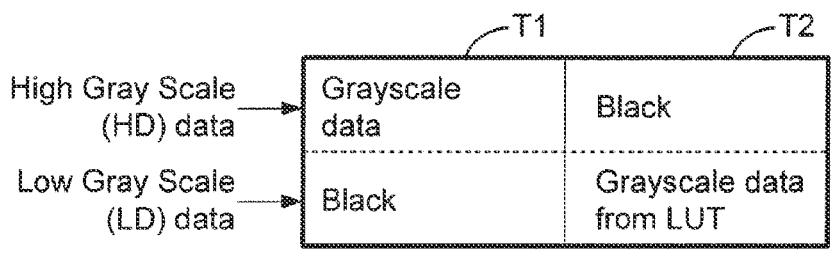
FIG. 8 is a diagrammatic illustration of the data used to drive any given pixel in the two sub-frame time periods illustrated in FIG. 4, when the raw grayscale image data is in either of two different ranges.
Figure 10:
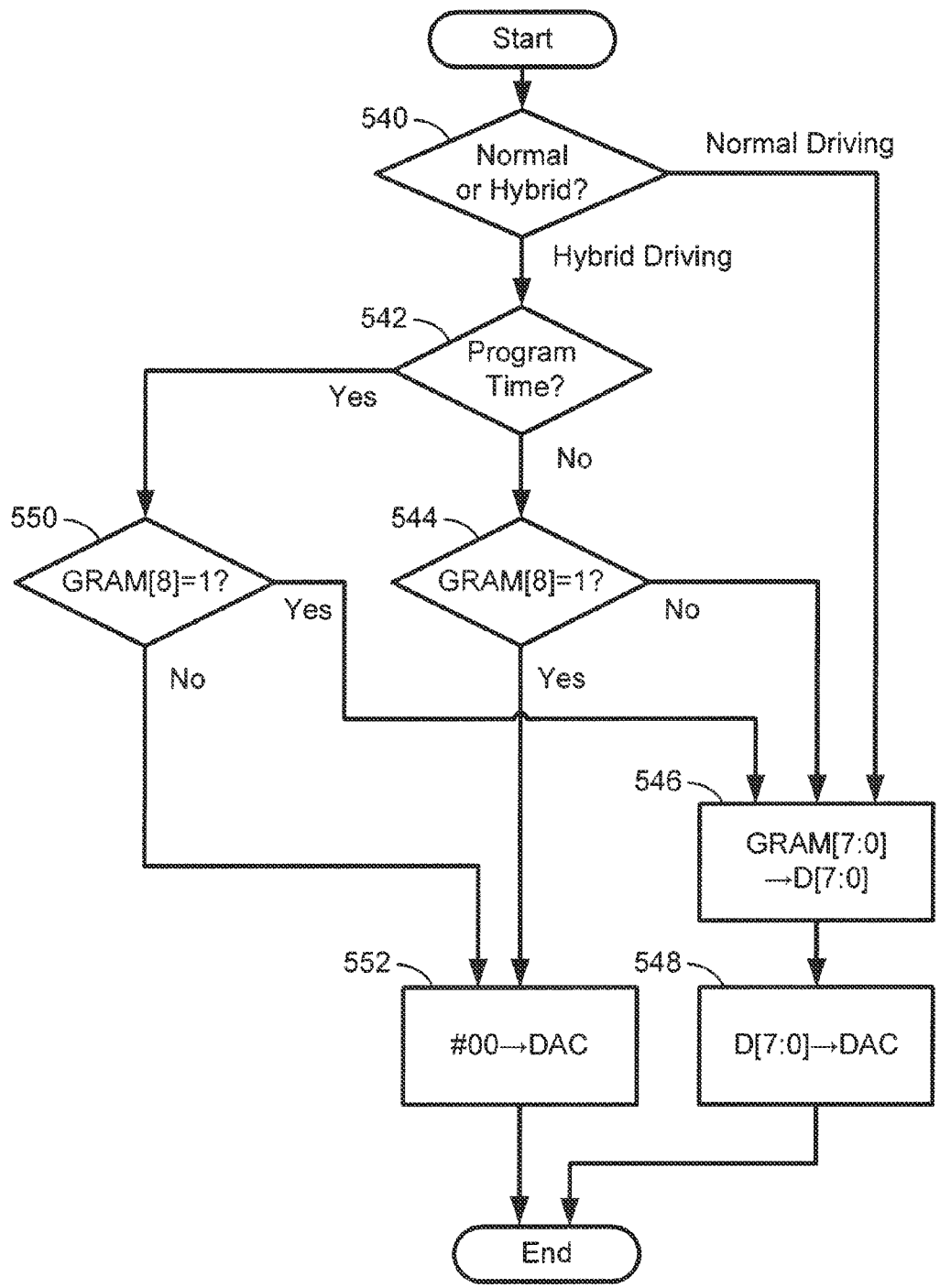
FIG. 10 is a flow chart of a process executed by the source driver to supply drive data to the pixels in either of two different operating modes.

FIG. 10 is a flow chart of one example of an operation for reading 9-bit GRAM data words and providing that data to the DAC 322. The system (e.g., the processing circuit 330) determines whether the current system mode is the normal driving mode or the hybrid driving mode at step 540. If the current mode is the hybrid driving mode, the system determines whether it is currently in a programming time at step 542. If the answer at step 542 is negative, step 544 determines whether GRAM [8]=1, which indicates the raw grayscale value was in the low range LG. If the answer at step at step 544 is negative, indicating that the raw grayscale value is in the high range HG, GRAM [7:0] is provided as local data D[7:0] and the values of the appropriate LUT 132 are used at step 546 to provide the data D [7:0] to the DAC 322 at step 548. If the answer at step 544 is affirmative, Black (VSL) ("#00") is provided to the DAC 322 at step 552, so that black level voltage is output from the DAC 122 (see FIG. 8).

In the programming period, step 550 determines whether GRAM [8]=1. If the answer at step 550 is affirmative indicating the raw grayscale value is in the high range HG, the system advances to steps 546 and 548. If the answer at step 550 is negative indicating the raw grayscale value is in the low range LG, the system advances to step 552 to output a black-level voltage (see FIG. 8).

Figure 11:
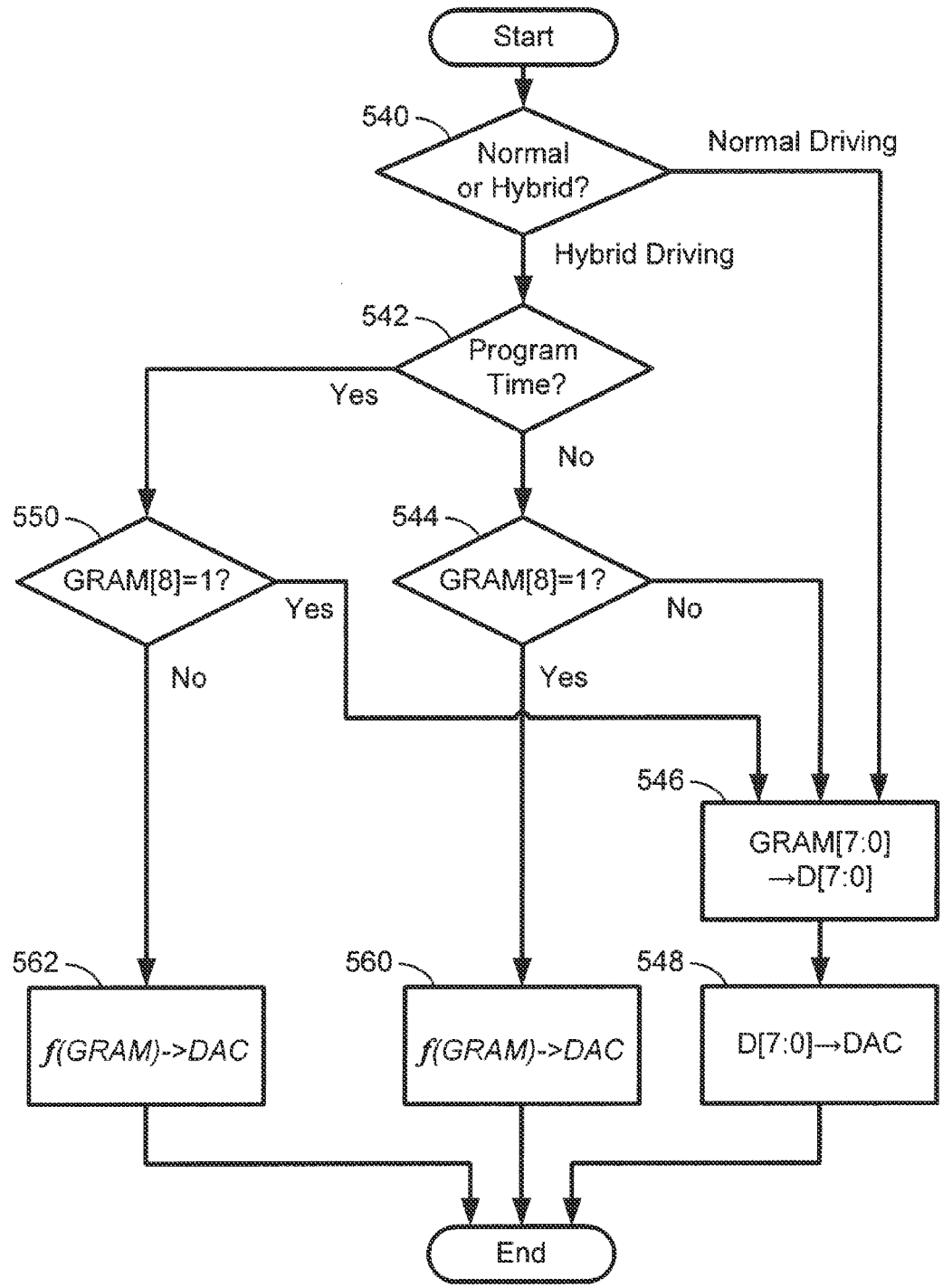
FIG. 11 is a flow chart of the same process illustrated in FIG. 10 with the addition of smoothing functions.

FIG. 11 is a flow chart of another example of an operation for reading 9-bit GRAM data and providing that data to the DAC 322. To avoid contorting effects during the transaction, the routine of FIG. 11 uses a smoothing function for a different part of a frame. The smoothing function can be, but is not limited to, offset, shift or partial inversion. In FIG. 11, the step 552 of FIG. 10 is replaced with steps 560 and 562. When the system is not in a programming period, if GRAM [8]=1 (high range HG grayscale value), GRAM [7:0] is processed by the smoothing function $f$ and then provided to the DAC 322 at step 560. In the programming period, if GRAM[8]≠1 (low range LG grayscale value), GRAM [7:0] is processed by the smoothing function f and then provided to the DAC 322 at step 562.

Figure 12:
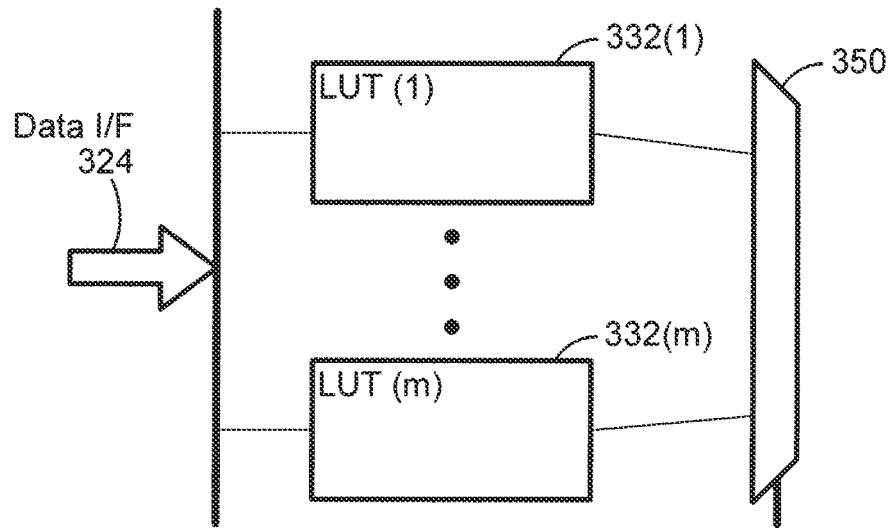
FIG. 12 is a diagram illustrating the use of multiple lookup tables in the processing circuit in the source driver.

Although only one hybrid LUT 332 is illustrated in FIG. 3, more than one hybrid LUT may be used, as illustrated in FIG. 12. In FIG. 12, a plurality of hybrid LUTs 332 (1) . . . 332 (m) receive data from, and have outputs coupled to, a multiplexer 350. Different ranges of grayscale values can be converted in different hybrid LUTs.

Figure 13:
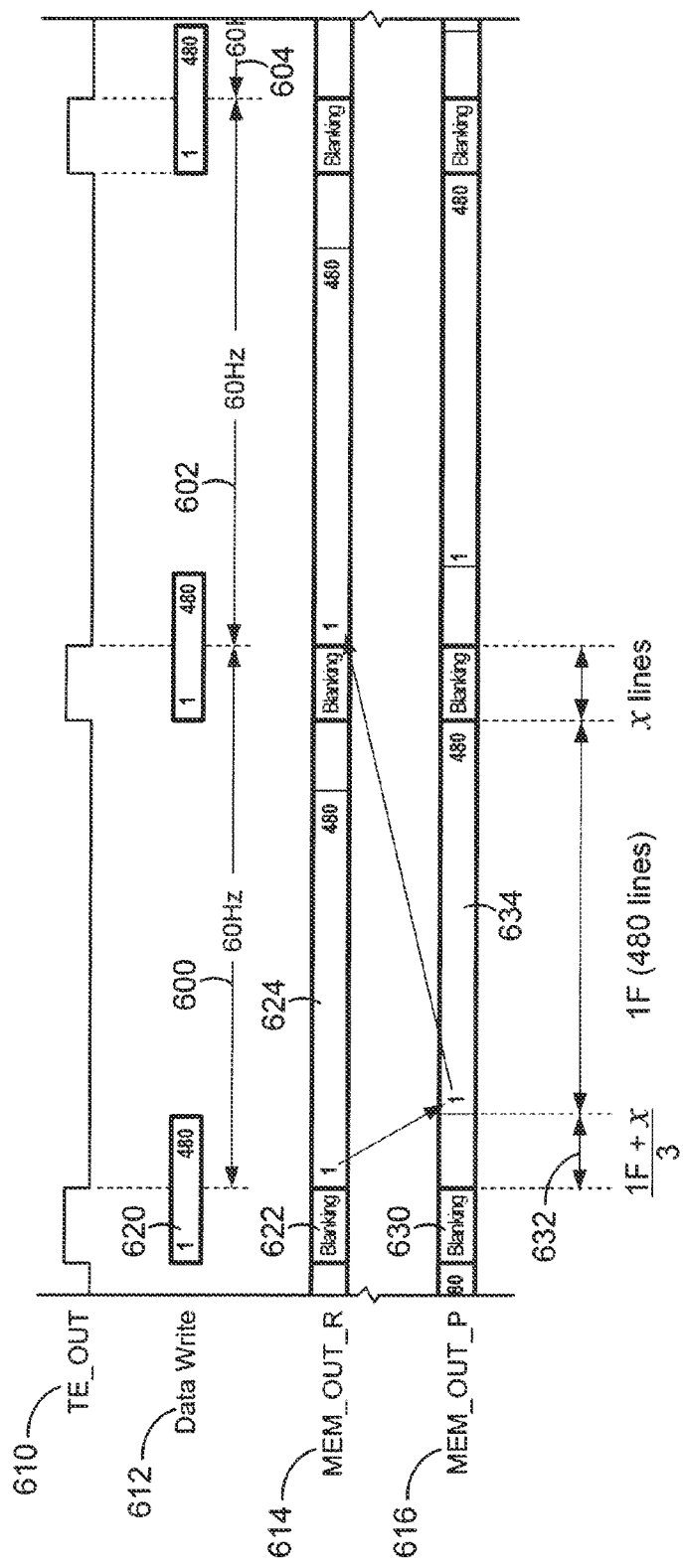
FIG. 13 is a timing diagram of the programming signals sent to each row during a frame interval in the hybrid driving mode of the AMOLED display in FIG. 1.

FIG. 13 is a timing diagram of the programming signals sent to each row during a frame interval in the hybrid driving mode of the AMOLED display in FIG. 1 and FIG. 3. Each frame is assigned a time interval such as the time intervals 600, 602, and 604, which is sufficient to program each row in the display. In this example, the display has 480 rows. Each of the 480 rows include pixels for corresponding image data that may be in the low grayscale value range or the high grayscale value range. In this example, each of the time intervals 600, 602, and 604 represents 60 frames per second or a frequency of 60 Hz. Of course other higher and lower frequencies and different numbers of rows may be used with the hybrid driving mode.

The timing diagram in FIG. 13 includes control signals necessary to avoid a tearing effect where programming data for the high and low grayscale values may overlap. The control signals include a tearing signal line 610, a data write signal line 612, a memory out low value (R) signal line 614 and a memory out high value (P) signal line 616. The hybrid driving mode is initiated for each frame by enabling the tearing signal line 610. The data write signal line 612 receives the row programming data 620 for each of the rows in the display system 100. The programming data 620 is processed using the LUTs as described above to convert the data to analog values reflecting higher luminance values for shortened intervals for each of the pixels in each row. During this time, a blanking interval 622 and a blanking interval 630 represent no output through the memory write lines 614 and 616 respectively.

Once the tearing signal line 610 is set low, a row programming data block 624 is output from the memory out low value line 614. The row programming data block 624 includes programming data for all pixels in each row in succession beginning with row 1. The row programming data block 624 includes only data for the pixels in the selected row that are to be driven at values in the low grayscale range. As explained above, all pixels that are to be driven at values in the high grayscale range in a selected row are set to zero voltage or adjusted for distortions. Thus, as each row is strobed, the DAC 322 converts the low gray scale range data (for pixels programmed in the low grayscale range) and sends the programming signals to the pixels (LUT modified data for the low grayscale range pixels and a zero voltage or distortion adjustment for the high grayscale range pixels) in that row.

While the row programming data block 624 is output, the memory output high value signal line 616 remains inactive for a delay period 632. After the delay period 632, a row programming data block 634 is output from the memory out high value line 616. The row programming data block 634 includes programming data for all pixels in each row in succession beginning with row 1. The row programming data block 634 includes only data for the pixels that are to be driven at values in the high grayscale range in the selected row. As explained above, all pixels that are to be driven at values in the low grayscale range in the selected row are set to zero voltage. The DAC 322 converts the high gray scale range data (for pixels programmed in the high grayscale range) and sends the programming signals to the pixels (LUT modified data for the high grayscale range pixels and a zero voltage for the low grayscale range pixels) in that row.

In this example, the delay period 632 is set to 1F+x/3 where F is the time it takes to program all 480 rows and x is the time of the blanking intervals 622 and 630. The x variable may be defined by the manufacturer based on the speed of the components such as the processing circuit 330 necessary to eliminate tearing. Therefore, x may be lower for faster processing components. The delay period 632 between programming pixels emitting a level in the low grayscale range and those pixels emitting a level in the high grayscale range avoids the tearing effect.

Figure 14A:
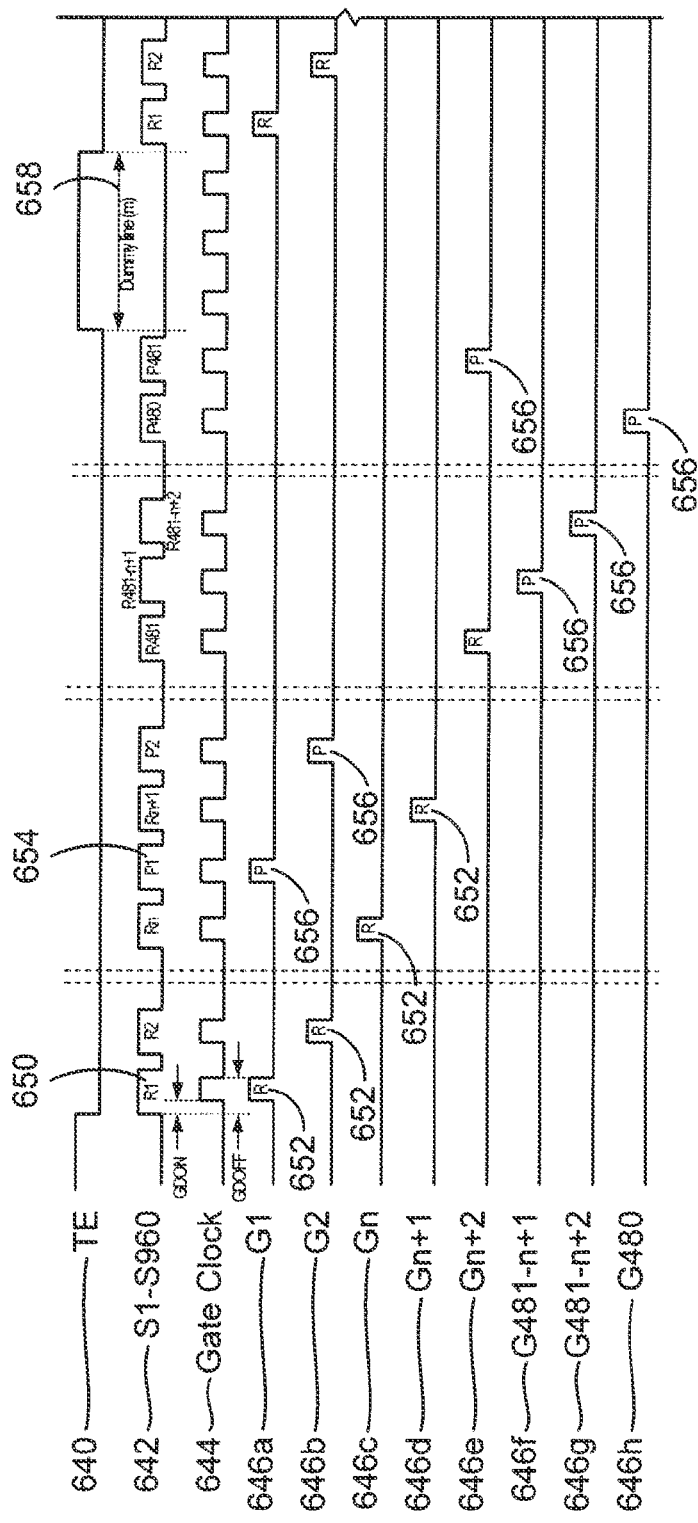
FIG. 14A is a timing diagram for row and column drive signals showing programming and non-programming times for the hybrid drive mode using a single pulse.

FIG. 14A is a timing diagram for row and column drive signals showing programming and non-programming times for the hybrid drive mode using a single pulse for the AMOLED display in FIG. 1. The diagram in FIG. 14A includes a tearing signal 640, a set of programming voltage select signals 642, a gate clock signal 644, and row strobe signals 646a-646h. The tearing signal 640 is strobed low to initiate the hybrid drive mode for a particular video frame. The programming voltage select signals 642 allow the selection of all of the pixels in a particular row for receiving programming voltages from the DAC 322 in FIG. 3. In this example, there are 960 pixels in each row. The programming voltage select signals 642 initially are selected to send a set of low grayscale range programming voltages 650 to the pixels of the first row.

When the gate clock signal 644 is set high, the strobe signal 646a for the first row produces a pulse 652 to select the row. The low gray scale pixels in that row are then driven by the programming voltages from the DAC 322 while the high grayscale pixels are driven to zero voltage. After a sub-frame time period, the programming voltage select signals 642 are selected to send a set of high grayscale range programming voltages 654 to the first row. When the gate clock signal 644 is set high, the strobe signal 646a for the first row produces a second pulse 656 to select the row. The high grayscale pixels in that row are then driven by the programming voltages from the DAC 322 while the low grayscale pixels are driven to zero voltage.

As is shown by FIG. 14A, this process is repeated for each of the rows via the row strobe signals 646b-646g. Each row is therefore strobed twice, once for programming the low grayscale pixels and once for programming the high grayscale values. When the first row is strobed the second time 656 for programming the high grayscale values, the first strobes for subsequent rows such as strobes 646c, 646d are initiated until the last row strobe (row 481) shown as strobe 646e. The subsequent rows then are strobed a second time in sequence as shown by the programming voltages 656 on the strobes 646f, 646g, 646h until the last row strobe (row 481) shown as strobe 646e.

Figure 14B:
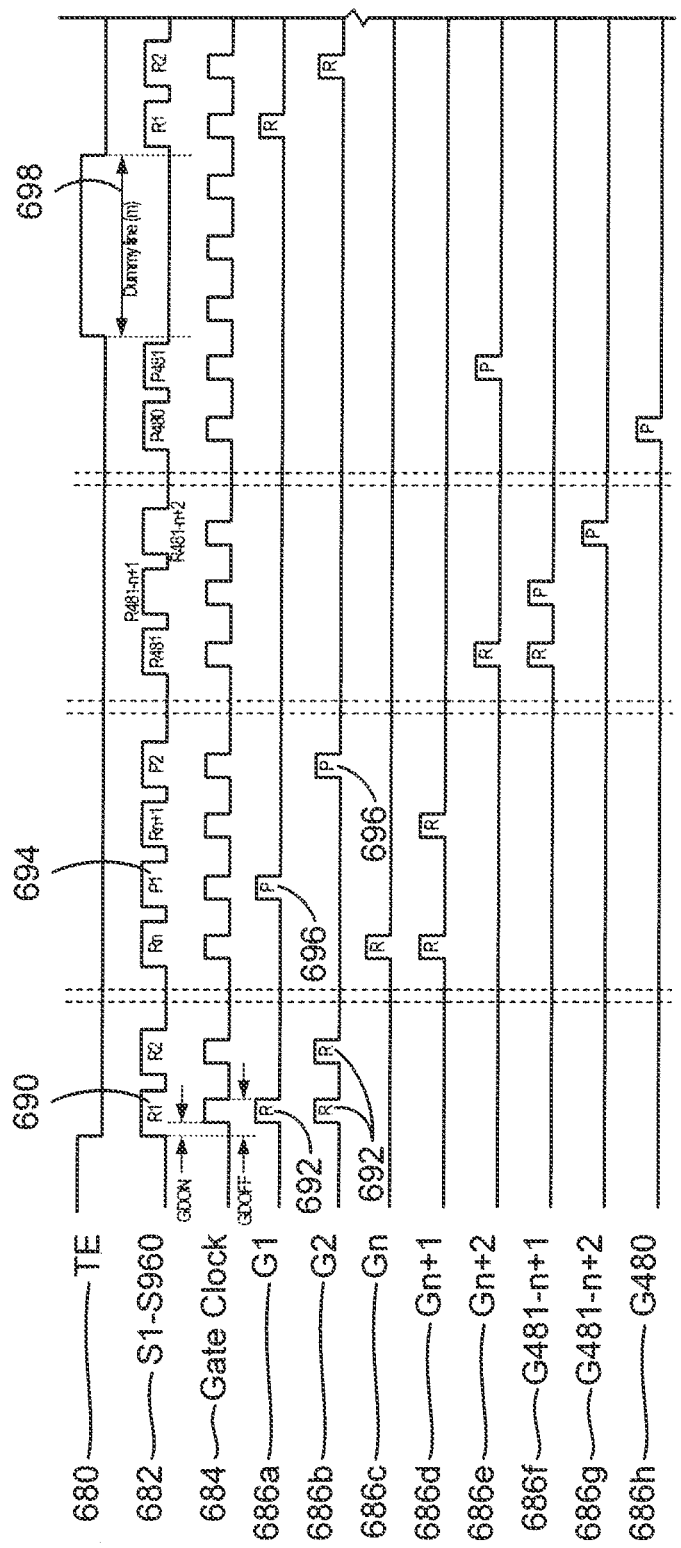
FIG. 14B is a timing diagram is a timing diagram for row and column drive signals showing programming and non-programming times for the hybrid drive mode using a double pulse.

FIG. 14B is a timing diagram for row and column drive signals showing programming and non-programming times for the hybrid drive mode using a double pulse. The double pulse to the drive circuit of the next row leaves the leakage path on for the drive transistor and helps improve compensation for the drive transistors. Similar to FIG. 14A, the diagram in FIG. 14B includes a tearing signal 680, a set of programming voltage select signals 682, a gate clock signal 684, and row strobe signals 686a-686h. The tearing signal 680 is strobed low to initiate the hybrid drive mode for a particular video frame. The programming voltage select signals 682 allow the selection of all of the pixels in a particular row for receiving programming voltages from the DAC 322 in FIG. 3. In this example, there are 960 pixels in each row. The programming voltage select signals 682 initially are selected to send a set of low grayscale range programming voltages 690 to the first row. When the gate clock signal 684 is set high, the strobe signal 686*a* for the first row produces a pulse 692 to select the row. The low gray scale pixels in that row are then driven by the programming voltages from the DAC 322 while the high grayscale pixels are driven to zero voltage. After a sub-frame time period, the programming voltage select signals 682 are selected to send a set of high grayscale range programming voltages 694 to the first row. When the gate clock signal 684 is set high, the strobe signal 686*a* for the first row produces a second pulse 696 to select the row. The high grayscale pixels in that row are then driven by the programming voltages from the DAC 322 while the low grayscale pixels are driven to zero voltage.

As is shown by FIG. 14B, this process is repeated for each of the rows via the row strobe signals 686*b*-686*h*. Each row is therefore strobed once for programming the low grayscale pixels and once for programming the high grayscale values. Each row is also strobed simultaneously with the previous row, such as the high strobe pulses 692 on the row strobe line 686*a* and 686*b*, in order to leave the leakage path on for the drive transistor. A dummy line that is strobed for the purpose of leaving the leakage path on for the drive transistor for the last active row (row 481) shown as strobe 646*e* in the display.

Figure 15:
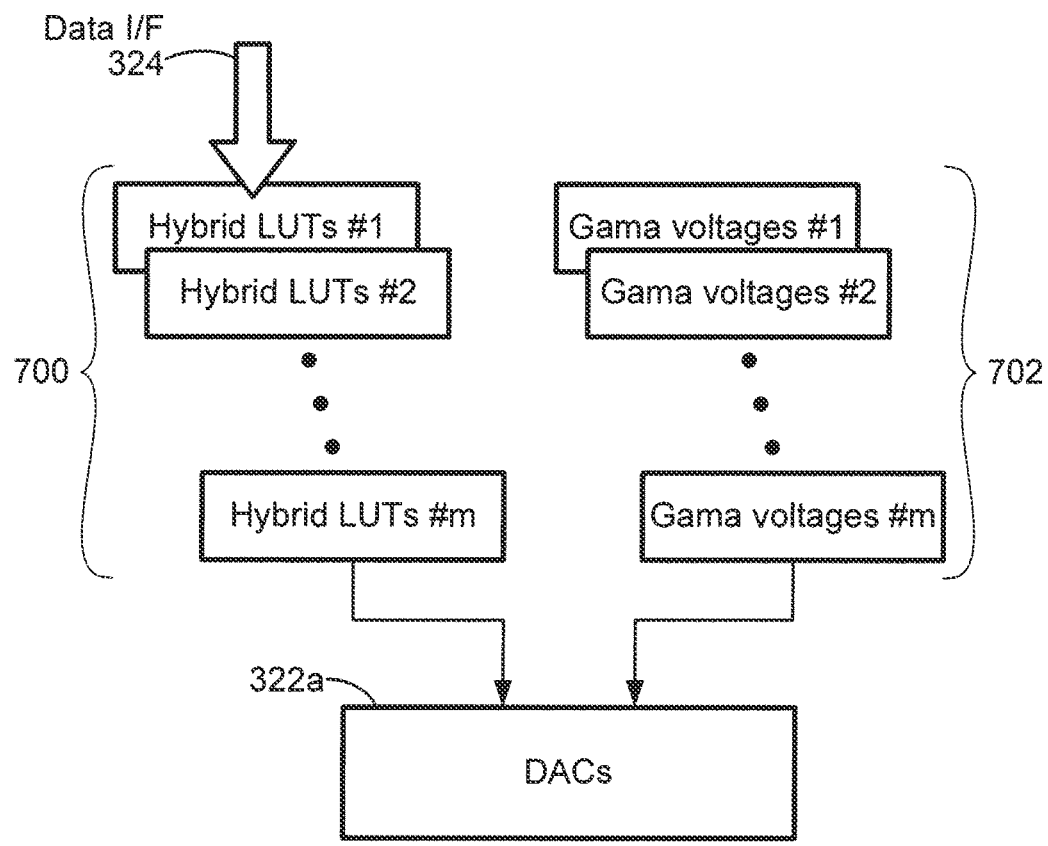
FIG. 15 is a diagram illustrating the use of multiple lookup tables and multiple gamma curves.

FIG. 15 illustrates a system implementation for accommodating multiple gamma curves for different applications and automatic brightness control, using the hybrid driving scheme. The automatic brightness control is a feature where the controller 112 adjusts the overall luminance level of the display system 100 according to the level of ambient light detected by the light sensor 130 in FIG. 1. In this example, the display system 100 may have four levels of brightness: bright, normal, dim and dimmest. Of course any number of levels of brightness may be used.

In FIG. 15, a different set of voltages from LUTs 700 (#1-#n) is provided to a plurality of DAC decoders 322*a* in the source driver 110. The set of voltages is used to change the display peak brightness using the different sets of voltages 700. Multiple gamma LUTs 702 (#1-#m) are provided so that the DACs 322*a* can also change the voltages from the hybrid LUTs 700 to obtain a more solid gamma curve despite changing the peak brightness.

In this example, there are 18 conditions with 18 corresponding gamma curve LUTs stored in a memory of the gamma correction circuit 340 in FIG. 3. There are six gamma conditions (gamma 2.2 bright, gamma 2.2 normal, gamma 2.2 dim, gamma 1.0, gamma 1.8 and gamma 2.5) for each color (red, green and blue). Three gamma conditions, gamma 2.2 bright, gamma 2.2 normal and gamma 2.2 dim, are used according to the brightness level. In this example, the dim and dimmest brightness levels both use the gamma 2.2 dim condition. The other gamma conditions are used for application specific requirements. Each of the six gamma conditions for each color has its own gamma curve LUT 702 in FIG. 13 which is accessed depending on the specific color pixel and the required gamma condition in accordance with the brightness control.

Figure 16A:
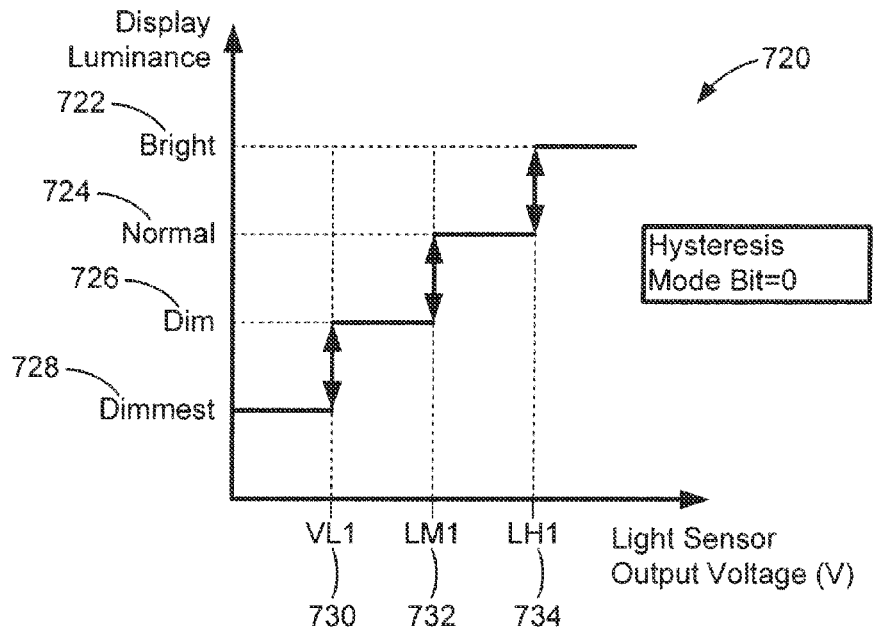
FIG. 16A is a luminance level graph of the AMOLED display in FIG. 1 for automatic brightness control without hysteresis.
Figure 16B:
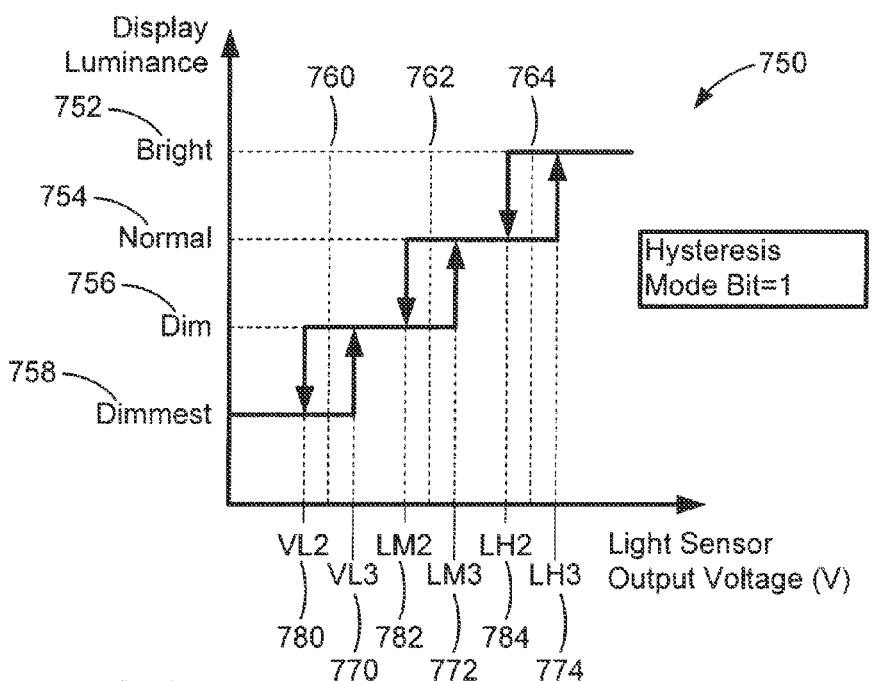
FIG. 16B is a luminance level graph of the AMOLED display in FIG. 1 for automatic brightness control with hysteresis.

FIGS. 16A and 16B are graphs of two modes of the brightness control that may be implemented by the controller 112. FIG. 16A shows the brightness control without hysteresis. The y-axis of the graph 720 shows the four levels of overall luminance of the display system 100. The luminance levels include a bright level 722, a normal level 724, a dim level 726 and a dimmest level 728. The x-axis of the graph 720 represents the output of the light sensor 130. Thus, as the output of the light sensor 130 in FIG. 1 increases past certain threshold levels, indicating greater levels of ambient light, the luminance of the display system 100 is increased. The x-axis shows a low level 730, a middle level 732 and a high level 734. When the detected output from the light sensor crosses one of the levels 730, 732 or 734, the luminance level is adjusted downward or upward to the next level using the LUTs 700 in FIG. 15. For example, when the ambient light detected exceeds the middle level 732, the luminance of the display is adjusted up to the normal level 724. If ambient light is reduced below the low level 730, the luminance of the display is adjusted down to the dimmest level 728.

FIG. 16B is a graph 750 showing the brightness control of the display system 100 in hysteresis mode. In order to allow smoother transitions to the eye, the brightness levels are sustained for a longer period when transitions are made between luminance levels. Similar to FIG. 16A, the y-axis of the graph 750 shows the four levels of overall luminance of the display system 100. The levels include a bright level 752, a normal level 754, a dim level 756 and a dimmest level 758. The x-axis of the graph 750 represents the output of the light sensor 130. Thus, as the output increases past certain threshold levels, indicating greater levels of ambient light, the luminance of the display system 100 is increased. The x-axis shows a low base level 760, a middle base level 762 and a high level 764. Each level 760, 762 and 764 includes a corresponding increase threshold level 770, 772 and 774 and a corresponding decrease threshold level 780, 782 and 784. Increases in luminance require greater ambient light than the base levels 760, 762 and 764. For example, when the detected ambient light exceeds an increase threshold level such as the threshold level 770, the luminance of the display is adjusted up to the dim level 756. Decreases in luminance require less ambient light than the base levels 760, 762 and 764. For example, if ambient light is reduced below the decrease threshold level 794, the luminance of the display is adjusted down to the normal level 754.

In a modified embodiment illustrated in FIGS. 17A-17E, the raw input grayscale values are converted to two different sub-frame grayscale values for two different sub-frames SF1 and SF2 of each frame F, so that the current levels are controlled to both enhance compensation and add relaxation intervals to extend the lifetime of the display. In the example in FIGS. 17A-17E, the duration of the first sub-frame SF1 is ¼ of the total frame time F, and the duration of the second sub-frame SF2 is the remaining ¾ of the total frame time F.

Figure 17A:
FIGS. 17A-17E are diagrammatic illustrations of a modified driving scheme.
Figure 17B:

As depicted in FIG. 17A, as the value of the raw input grayscale values can range from zero to 255. As the input grayscale values increase from zero, those values are converted to increased values sf1_gsv for the first sub-frame SF1, and the grayscale value sf2_gsv for the second sub-frame SF2 is maintained at zero. This conversion may be effected using a look-up-table (LUT) that maps each grayscale input value to an increased sub-frame value sf1_gsv according to a gamma 2.2 curve. As the input grayscale values increase, the second sub-frame value remains at zero (at relaxation) until the first sub-frame value sf1_gsv reaches a preset threshold value sf1_max, e.g., 255, as depicted in FIG. 17B. Thus, up to this point no drive current is supplied to the pixel during the second sub-frame SF2 and so that the pixel remains black (at relaxation) during the second sub-frame SF2. The desired luminance represented by the input grayscale value is still achieved because the first sub-frame value sf1_gsv from the LUT is greater than the input value, which represents the desired luminance for an entire frame F. This improves compensation by providing a higher leakage current.

Figure 17C:
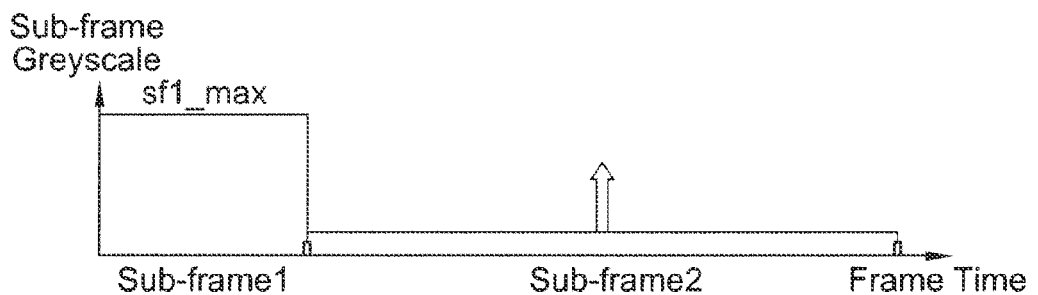

As depicted in FIG. 17C, after the threshold grayscale value sf1_max is reached, the first sub-frame grayscale value sf1_gsv remains at that maximum value as the input value continues to increase, while the second sub-frame grayscale value sf2_gsv begins to increase from zero. From this stage on, the LUT uses the following equation to govern the relationship between the first and second grayscale values:

$$sf1\_gsv = \min[255 - sf2\_gsv + 128, sf1\_max] \quad (1)$$

Figure 17D:
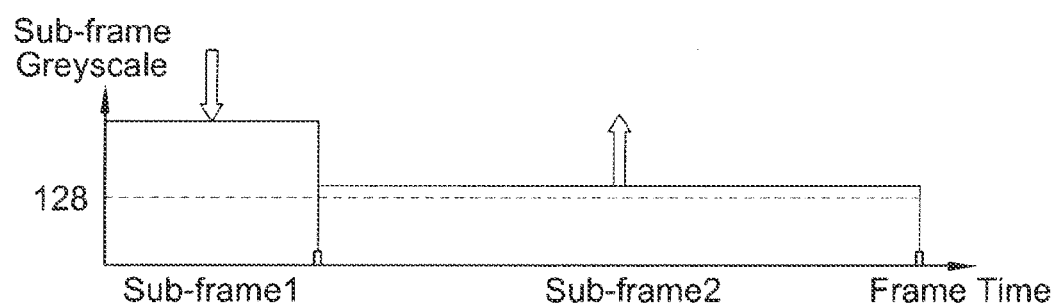

Thus, as the second sub-frame value sf2_gsv increases, the first sub-frame value sf1_gsv remains at sf1_max, until the second sub-frame value sf2_gsv reaches a first threshold value sf2_th, e.g., 128. As depicted in FIG. 17D, when the input grayscale value increases to a value that causes the second sub-frame value sf2_gsv to increase above the threshold value sf2_th, the value of sf2_gsv continues to increase while the first sub-frame value sf1_gsv is decreased by the same amount. This relationship causes the total luminance (sum of luminance from both sub-frames) vs. the raw grayscale input values to follow a gamma curve of 2.2.

Figure 17E:
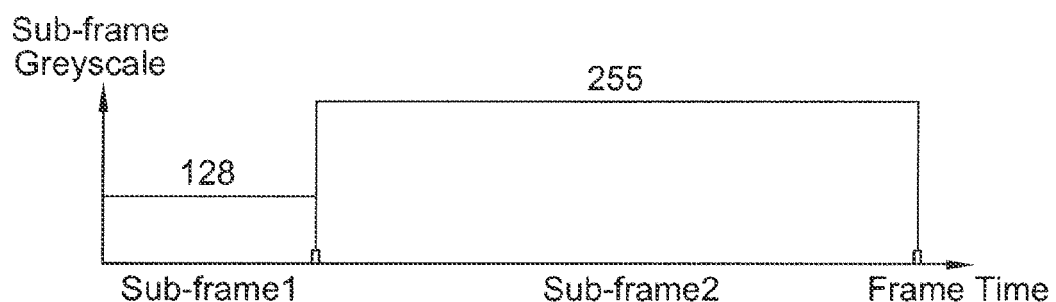

As shown in FIG. 17E, the concurrent increasing of sf2_gsv and decreasing of sf1_gsv continues until sf2_gsv reaches a maximum value sf2_max, e.g., 255, which corresponds to a sf1_gsv value of 128 according to Equation (1). At this point the input grayscale value is at its maximum, e.g., 255, where the pixel is at full brightness. The reduced first sub-frame value sf1_gsv provides a moderate relaxation to the pixel when running at full brightness, to extend the pixel lifetime.

Figure 18:
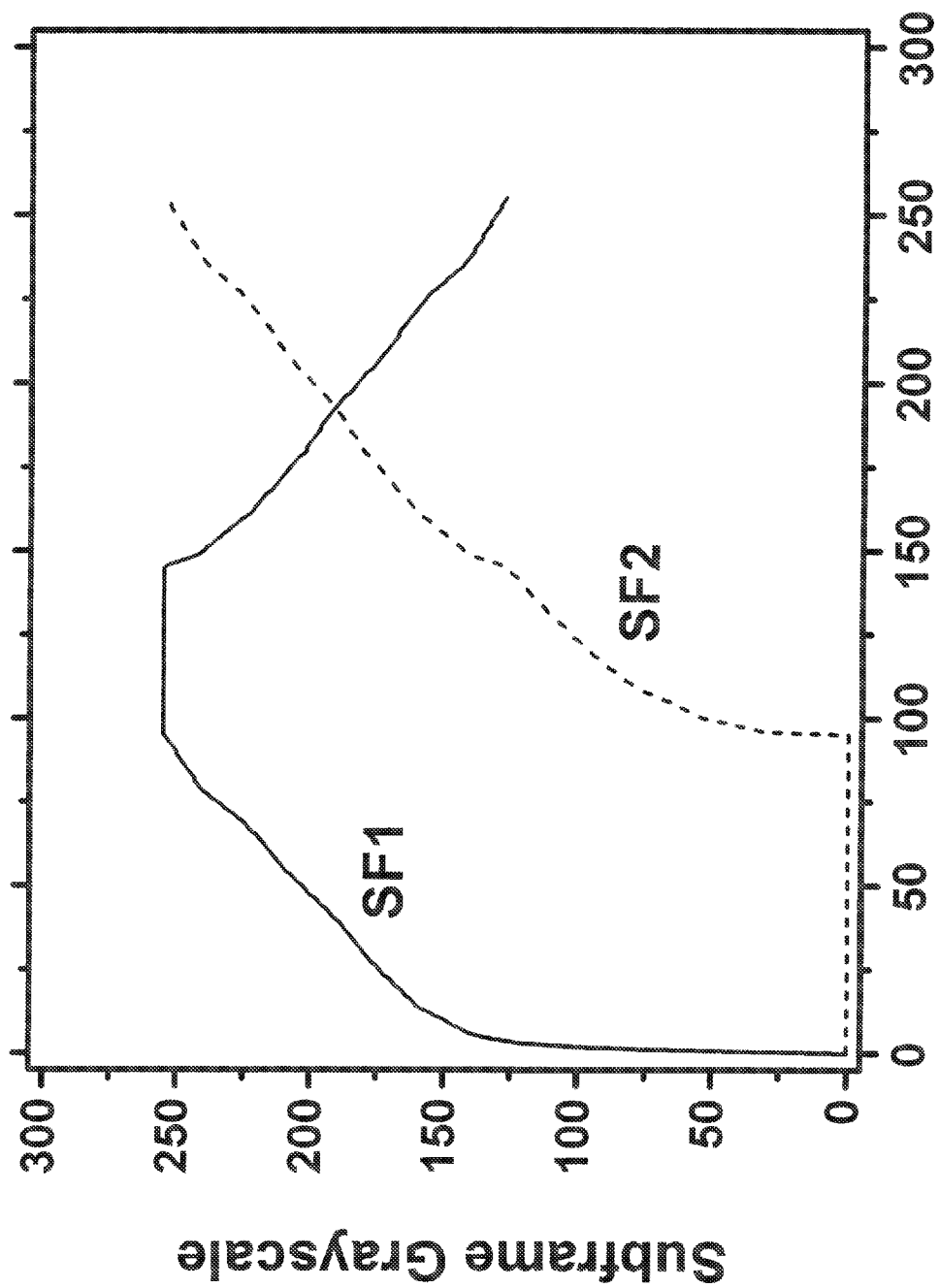
FIG. 18 is a plot of raw input grayscale values vs. converted grayscale values for two different sub-frames, in a further modified driving scheme.

A second implementation utilizes an LUT containing grayscale data depicted by the curves in FIG. 18, which has the raw grayscale input values on the x axis and the corresponding sub-frame values on the y axis. The values sf1_gsv for the first sub-frame are depicted by the solid-line curve SF1, and the values sf2_gsv for the second sub-frame are depicted by the broken-line curve SF2. These sub-frame values sf1_gsv and sf2_gsv are generated from a look-up table (LUT) which maps the input grayscale value to sub-frame values sf1_gsv and sf2_gsv that increase the luminance according to a gamma 2.2 curve as the input grayscale value increases.

As the input grayscale value increases from zero to 95, the value of sf1_gsv increases from zero to a threshold value sf1_max (e.g., 255), and the value of sf2_gsv remains at zero. Thus, whenever the input grayscale value is in this range, the pixel will be black during the second sub-frame SF2, which provides a relaxation interval that helps reduce the rate of degradation and thereby extend the life of that pixel.

When the input grayscale value reaches 96, the LUT begins to increase the value of sf2_gsv and maintains the value of sf1_gsv at 255. When the input grayscale value reaches 145, the LUT progressively decreases the value of sf1_gsv from 255 while continuing to progressively increase the value of sf2_gsv.

For external compensation of pixel aging and non-uniformity of OLED displays, the video data is manipulated to compensate for the aging and non-uniformity. Therefore, the calibrated data needs higher resolution and larger dynamic range than those of the video data. While one can use compression to have larger data driver output than that of the video data, this method either requires higher bit resolution driver or loses resolution from the video.

The following embodiments resolve the aforementioned issues by increasing the driver resolution using spatial or frame or time division compensation.

Frame Division Compensation

Figure 19:
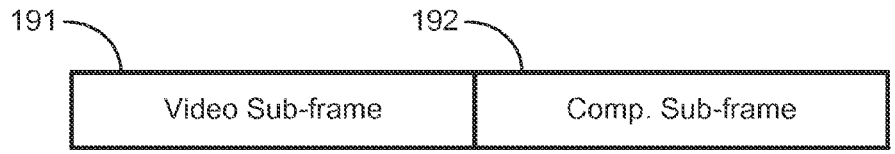
FIG. 19 is a diagrammatic illustration of frame division compensation using separate video and compensation sub-frames.

FIG. 19 illustrates a first embodiment, in which:
1) The frame is divided into two or more sub-frames 191 and 192 (or two or more consecutive frames are used as one set of sub-frames).
2) The compensation data is applied to at least one of the sub-frames.
3) The video sub-frames and compensation sub-frames are different.
4) Thus, both video and compensation data can be as large as data resolution of the driver.
5) The sub-frames can have different size. For example, the video sub-frame can be longer than the compensation sub-frame. This results in less brightness reduction because of using part of the frame for compensation. It also results in smaller steps for compensation due to the smaller sub-frame, which can improve the external compensation accuracy.

Figure 20:
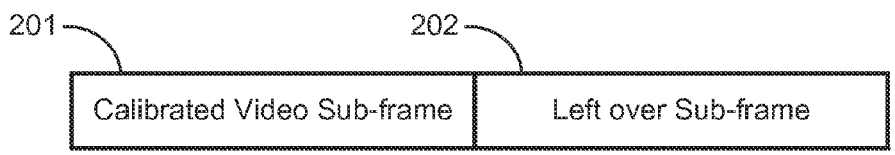
FIG. 20 is a diagrammatic illustration of frame division compensation using a left-over sub-frame for extra data when the video calibrated data is larger than the data resolution of the driver.

FIG. 20 illustrates a second embodiment, in which:
1) The frame is divided into two or more sub frames 201 and 202.
2) The compensation data is applied to at least one of the sub-frames 201.
3) If the video calibrated data is larger than the data resolution of the driver, the extra data can be transferred to the other sub-frame 202 (left-over sub-frame).
4) There can be multiple left-over sub-frames.
5) The sub-frames can have different sizes.

Figure 21:
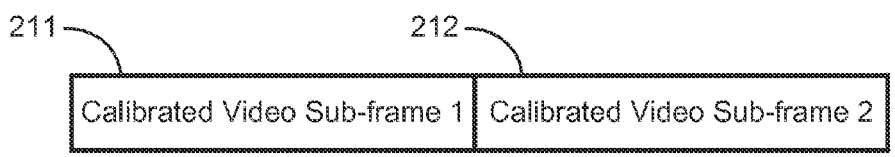
FIG. 21 is a diagrammatic illustration of frame division compensation using compensation data divided between sub-frames.

FIG. 21 illustrates a third embodiment, in which:
1) The frame is divided into two or more sub-frames 211 and 212.
2) The compensation data is divided between sub-frames (this division can be with different weights, but the best visual effect is achieved when the video is divided by sub-frames equally and the residue value is applied to one or more than one sub-frame).
3) The sub-frames can have different sizes.

Time Division Compensation

Figure 22:
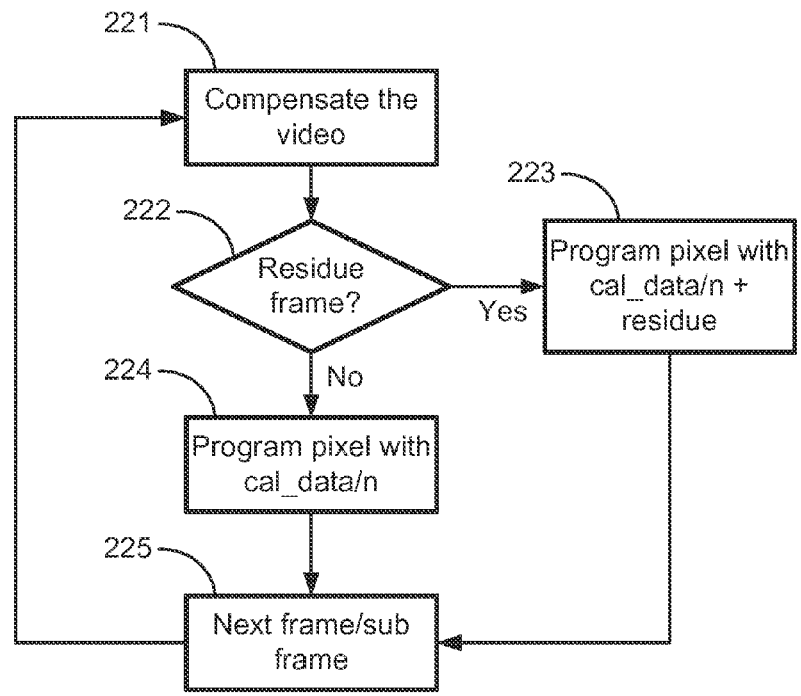
FIG. 22 is a diagrammatic illustration of frame division compensation with a residue sub-frame.

FIG. 22 illustrates a first embodiment, in which the calibrated video data 221, which is the video data manipulated with the compensation data, is in two or more frames. For example, if two frames are used for this purpose, the calibrated data is divided by two and each frame contains half of the calibrated data. The residue of the division can be shown in either of the frames. For example, if the calibrated data is 311, one frame contains 155 and the other frame contains 156.

Step 222 determines whether there is a residue. If the answer is affirmative, step 223 programs a pixel with one segment of the calibrated data plus the residue, which becomes the next frame or sub-frame at step 225. If the answer at step 22 is negative, step 224 programs a pixel with one segment of the calibrated, which becomes the next frame or sub-frame at step 225.

Figure 23:
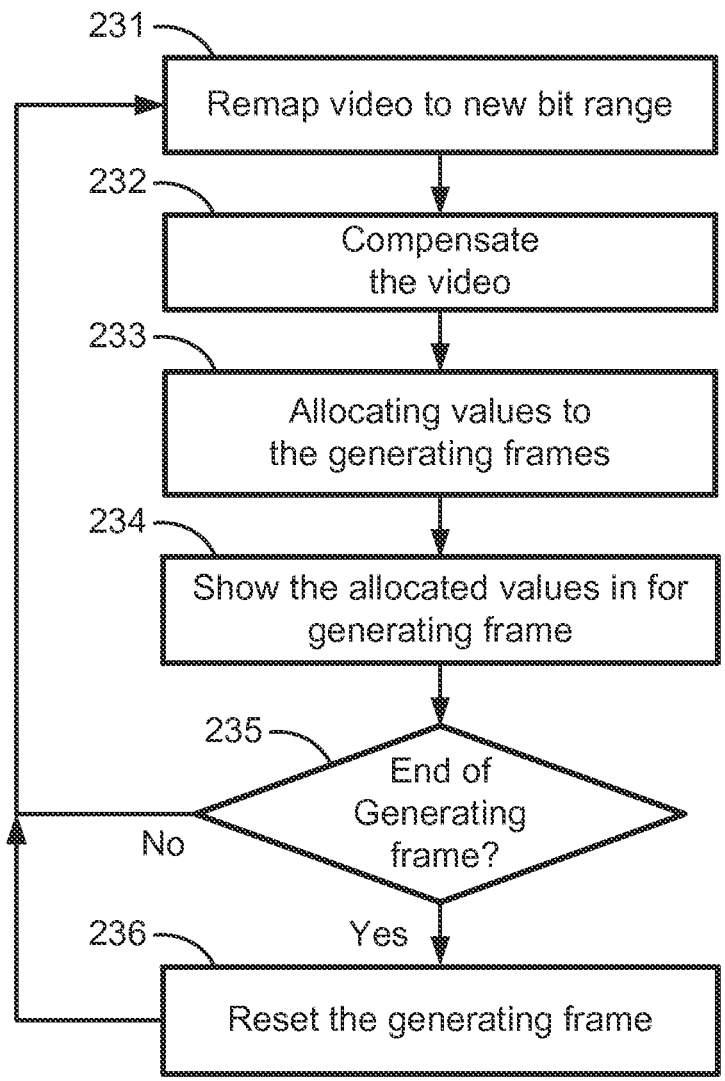
FIG. 23 is a diagrammatic illustration of frame division compensation using a residue sub-frame.

FIG. 23 illustrates another embodiment, in which the value required for calibration is reduced from the total bits available in all frames used for the programming. For example, if 'n' frame is used for generating the calibrated video data and the driver is capable of 'r' bit output, the total bits available will be 'n*r'. In case 'k' bits are needed for compensation, the total bits required for video are 'n*(r−k)'. In this case, the video is mapped to 'n*(r−k)' gray scale. While any combination of video and compensation data can be used to generate the calibrated value during the compensation frame, it is preferred to have the smaller difference between the values used in each frame, so that the visual artifact will be minimal. For example, if the calibrated video data is 321, and two frames are used to generate the calibrated video data, frame 1 will contain 160 and the second frame will contain 161.

In FIG. 23, the video data is re-mapped to a new bit range in step 231, and then the video data is compensated in step 232. Then step 233 allocates values to the generating frames, and step 234 shows the allocated values for a generated frame. Step 235 determines whether the end of a generating frame has been reached, and if the answer is negative, steps 231-235 are repeated. If the answer at step 235 is affirmative, the generating frame is reset at step 236, and the system returns to step 231.

Reducing Compensation Bit Allocation

Delta Value: In this case, the distribution of a parameter is extracted, and a value is chosen as base value. The base value can be the mean, average or median. The difference between the base value and each pixel parameters is stored as a delta value for that pixel. During compensation, the pixel value is calculated as base value+delta value. The distribution and base value can be calculated separately for different pixel groups. The pixel groups can be rows, or columns, or similar colors, or localized pixels, and any other type of possible grouping.

Differential values: In this case, a string of pixels is formed. The compensation parameter of a pixel in the string (link list or queue) is subtracted from the parameter of its previous pixel (or from the next pixel) parameter. The delta is stored as the differential compensation value for that pixel. The first pixel parameter (or last pixel parameter if the pixel's parameters are subtracted from the next ones) is stored as base value. The recursive addition of the values can create each pixel's parameters during compensation. For example, parameter of the pixel 'i' in the string in case of subtracting from the previous pixel parameter will be "base+delta(1)+delta(2)+ . . . +delta(i)." The string can be formed based on similarities in physical or characteristics. For example, each row (or column) can be a string. Or pixels with close characteristics can be one string. A pixel can be in different strings for different parameters.

While particular embodiments and applications of the present invention have been illustrated and described, it is to be understood that the invention is not limited to the precise construction and compositions disclosed herein and that various modifications, changes, and variations can be apparent from the foregoing descriptions without departing from the spirit and scope of the invention as defined in the appended claims.

What is claimed is:

1. A method of driving a display, the display for displaying image data in successive frames and having pixels that include a drive transistor and an organic light emitting device, said method comprising:
dividing each frame into a plurality of sub-frames,
supplying a pixel with a drive current that is based on data comprising said image data during one of said sub-frames, and
supplying the pixel with a drive current that is based on data comprising compensation data during at least two of said sub-frames, the compensation data divided among said at least two of said sub-frames,
thereby compensating for at least one of performance and a property of said pixel.

2. The method of claim 1 in which said data comprising said compensation data is supplied from a driver having a preselected data resolution, and which includes
determining whether the data comprising said compensation data is greater than the data resolution of said driver, and
if the data comprising said compensation data is greater than the data resolution of said driver, transferring the excess data comprising said compensation data to a different sub-frame.

3. The method of claim 1 in which the sub-frame during which the pixel is supplied with a drive current that is based on data comprising said image data is longer in duration than at least one other sub-frame during which the pixel is supplied with a drive current that is based on data comprising said compensation data.

4. A method of driving a display, the display for displaying image data in successive frames and having pixels that include a drive transistor and an organic light emitting device, said method comprising:
dividing each frame into a plurality of sub-frames,
dividing compensation data among said sub-frames, and
supplying a pixel with a drive current that is based on data comprising a division of said compensation data during each sub-frame into which said compensation data is divided,
thereby compensating for at least one of performance and a property of said pixel.

5. The method of claim 4 in which said compensation data is divided substantially equally among said sub-frames, and any residue value is supplied to one of the sub-frames.

6. The method of claim 4 in which said sub-frames have different sub-frame durations.

7. A method of driving a display, the display for displaying image data in successive frames and having pixels that include a drive transistor and an organic light emitting device, said method comprising:
dividing compensation data among a plurality of frames, and
supplying a pixel with a drive current that is based on data comprising a division of said compensation data during each frame into which said compensation data is divided,
thereby compensating for at least one of performance and a property of said pixel.

8. The method of claim 7, further comprising remapping the image data to a new bit range defined by the total number of bits available in all frames and the number of bits of said compensation data.

9. An apparatus for driving a display, the display for displaying image data in successive frames and having an array of pixels that each include a drive transistor and an organic light emitting device, multiple select lines coupled to said array for delivering signals that select when each pixel is to be driven, and multiple data lines for delivering drive signals to the selected pixels, said apparatus comprising:
a source driver coupled to said data lines and including a processing circuit for receiving said image data and adapted to
divide each frame into a plurality of sub-frames,
supply a pixel with a drive current that is based on data comprising said image data during one of said sub-frames, and
supply the pixel with a drive current that is based on data comprising compensation data during at least two of said sub-frames, the compensation data divided among said at least two of said sub-frames, to thereby compensate for at least one of performance and a property of each of said pixels.

10. The apparatus of claim 9 which said data comprising said compensation data is supplied from a driver having a preselected data resolution for supplying said data comprising said compensation data, and in which said processing circuit is adapted to
determine whether the data comprising said compensation data is greater than the data resolution of said driver, and
if the data comprising said compensation data is greater than the data resolution of said driver, transfer the excess data comprising said compensation data to a different sub-frame.

11. An apparatus for driving a display, the display for displaying image data in successive frames and having an array of pixels that each include a drive transistor and an organic light emitting device, multiple select lines coupled to said array for delivering signals that select when each pixel is to be driven, and multiple data lines for delivering drive signals to the selected pixels, said apparatus comprising:
a source driver coupled to said data lines and including a processing circuit for receiving said image data and adapted to
divide each frame into a plurality of sub-frames,
divide compensation data among said sub-frames, and
supply a pixel with a drive current that is based on data comprising a division of said compensation data during each sub-frame into which said compensation data is divided,
to thereby compensate for at least one of performance and a property of each of said pixels.

12. The apparatus of claim 11 in which said processing circuit is adapted to divide said compensation data substantially equally among said sub-frames, and any residue value is supplied to one of the sub-frames.

13. The apparatus of claim 11 in which said sub-frames have different sub-frame durations.

14. An apparatus for driving a display, the display for displaying image data in successive frames and having an array of pixels that each include a drive transistor and an organic light emitting device, multiple select lines coupled to said array for delivering signals that select when each pixel is to be driven, and multiple data lines for delivering drive signals to the selected pixels, said apparatus comprising:
a source driver coupled to said data lines and including a processing circuit for receiving said image data and adapted to
divide compensation data among a plurality of frames,
compensate image data based on divisions of said compensation data in each frame to compensate for at least one of performance and a property of each of said pixels, and
supply each pixel with a drive current that is based on the compensated image data during each frame.

15. The apparatus of claim 14, wherein the processing circuit is further adapted to remap the image data to a new bit range defined by the total number of bits available in all frames and the number of bits of said compensation data.

16. The apparatus of claim 14 in which a frame of said plurality of frames supplied with image data is longer than a frame of said plurality of frames supplied with compensation data.

* * * * *